United States Patent
Lee

(10) Patent No.: US 12,046,565 B2
(45) Date of Patent: Jul. 23, 2024

(54) VERTICAL MEMORY DEVICE WITH METAL AND SPACER SUPPORT STRUCTURE

(71) Applicant: SAMSUNG ELECTRONICS CO., LTD., Suwon-si (KR)

(72) Inventor: Jaegoo Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 462 days.

(21) Appl. No.: 17/378,831

(22) Filed: Jul. 19, 2021

(65) Prior Publication Data

US 2022/0208696 A1 Jun. 30, 2022

(30) Foreign Application Priority Data

Dec. 28, 2020 (KR) ........................ 10-2020-0184668

(51) Int. Cl.
*H01L 23/00* (2006.01)
*H01L 23/535* (2006.01)
*H10B 43/27* (2023.01)
*H10B 43/40* (2023.01)

(52) U.S. Cl.
CPC .......... *H01L 23/562* (2013.01); *H01L 23/535* (2013.01); *H10B 43/27* (2023.02); *H10B 43/40* (2023.02)

(58) Field of Classification Search
CPC ........ H10B 69/00; H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10;
(Continued)

(56) References Cited

U.S. PATENT DOCUMENTS

| 9,502,429 B2 | 11/2016 | Hironaga |
| 9,673,213 B1 | 6/2017 | Yu et al. |
| 9,991,271 B2 | 6/2018 | Kang et al. |

(Continued)

FOREIGN PATENT DOCUMENTS

JP 20180163981 8/2018

*Primary Examiner* — Didarul A Mazumder
*Assistant Examiner* — Gustavo G Ramallo
(74) *Attorney, Agent, or Firm* — Fish & Richardson P.C.

(57) ABSTRACT

A vertical memory device includes a cell stacked structure on a substrate, a support structure and cell contact plugs. The cell stacked structure includes gate patterns spaced apart from each other in a vertical direction and insulation layers between the gate patterns. The gate patterns extend in a first direction, and edges of the gate patterns along the first direction include step portions having step shape. The support structure passes through the cell stacked structure and the step portion of one of the gate patterns, and includes a spacer layer having cup shape, first metal patterns having ring shape, and a second metal pattern filling an inner space of the spacer layer. The cell contact plugs are on the step portions. The first metal patterns are at the same vertical levels of the gate patterns. Sidewalls of the first metal patterns are adjacent to sidewalls of the gate patterns.

20 Claims, 33 Drawing Sheets

(58) Field of Classification Search
CPC ........ H10B 51/20; H10B 51/30; H10B 51/40; H10B 51/50
See application file for complete search history.

(56) References Cited

U.S. PATENT DOCUMENTS

| | | |
|---|---|---|
| 10,141,331 B1 | 11/2018 | Susuki et al. |
| 10,192,784 B1 | 1/2019 | Cui et al. |
| 10,396,035 B2 | 8/2019 | Park |
| 10,727,248 B2 | 7/2020 | Kaminaga |
| 2012/0003831 A1* | 1/2012 | Kang .................. H10B 43/20 257/E21.645 |
| 2016/0005760 A1* | 1/2016 | Lee .................... H01L 29/1033 257/324 |
| 2016/0049423 A1* | 2/2016 | Yoo .................... H10B 43/40 257/329 |
| 2016/0086964 A1* | 3/2016 | Chien .................. H10B 43/27 438/269 |
| 2017/0084532 A1* | 3/2017 | Son ................... H01L 21/76877 |
| 2017/0148748 A1* | 5/2017 | Jeong ................. H10B 41/35 |
| 2018/0151672 A1* | 5/2018 | Choi .................. H01L 29/1037 |
| 2018/0226423 A1 | 8/2018 | Kang et al. |

\* cited by examiner

VERTICAL MEMORY DEVICE WITH METAL AND SPACER SUPPORT STRUCTURE

CROSS-REFERENCE TO RELATED APPLICATION

A claim of priority under 35 USC § 119 is made to Korean Patent Application No. 10-2020-0184668, filed on Dec. 28, 2020, in the Korean Intellectual Property Office (KIPO), the entirety of which is hereby incorporated by reference.

BACKGROUND

The present disclosure relates to vertical memory devices, and more particularly to vertical memory devices having stable structure.

Vertical memory devices in which memory cells are vertically stacked on a surface of a substrate may have recently been developed. As the number of stacked memory cells in a vertical memory device increases, forming memory cells having stable structure has become more difficult.

SUMMARY

Embodiments of the inventive concepts provide a vertical memory device including a cell stacked structure, a support structure and cell contact plugs. The cell stacked structure includes gate patterns and insulation layers on a substrate. The gate patterns are spaced apart from each other in a vertical direction perpendicular to an upper surface of the substrate, and the insulation layers are between the gate patterns in the vertical direction. The gate patterns extend in a first direction parallel to the upper surface of the substrate, and edges of the gate patterns along the first direction are step portions having step shape. The support structure passes through the cell stacked structure and passes through a step portion from among the step portions of one of the gate patterns. The support structure includes a first spacer layer having cup shape, first metal patterns, and a second metal pattern filling an inner space of the first spacer layer. Each of the first metal patterns has ring shape surrounding an outer wall of the first spacer layer. The cell contact plugs are respectively on the step portions of the gate patterns. The first metal patterns are respectively disposed at vertical levels of corresponding ones of the gate patterns. A sidewall of each of the first metal patterns is adjacent to a sidewall of the corresponding ones of the gate patterns.

Embodiments of the inventive concepts provide a vertical memory device including a circuit pattern on a substrate, a cell stacked structure, a channel structure, a support structure, a through via contact, cell contact plugs and a blocking layer. The substrate includes a first region, a second region, and a third region. The cell stacked structure is formed over the circuit pattern on the first region and the second region. The cell stacked structure includes gate patterns and insulation layers. The gate patterns are spaced apart from each other in a vertical direction perpendicular to an upper surface of the substrate, and the insulation layers are between the gate patterns in the vertical direction. The gate patterns extend in a first direction parallel to the upper surface of the substrate, and edges of the gate patterns along the first direction are step portions having step shape. The channel structure passes through the cell stacked structure in the first region. The support structure passes through the cell stacked structure in the second region and passes through a step portion from among the step portions of one of the gate patterns. The support structure includes a first spacer layer having cup shape, first metal patterns, and a second metal pattern filling an inner space of the first spacer layer. Each of the first metal patterns has ring shape surrounding an outer wall of the first spacer layer. The through via contact is spaced apart from the cell stacked structure. The through via contact extends in the vertical direction. The cell contact plugs are on the step portions of the gate patterns. The blocking layer surrounds a surface of each of the gate patterns. The first metal patterns are respectively disposed at vertical levels of corresponding ones of the gate patterns, and the blocking layer is interposed between sidewalls of the first metal patterns and sidewalls of the gate patterns adjacent thereto.

Embodiments of the inventive concepts provide a vertical memory device including a circuit pattern on a substrate, a lower cell stacked structure, an upper cell stacked structure, channel structures, a support structure, a through via contact and cell contact plugs. The substrate includes a first region, a second region, and a third region. The lower cell stacked structure is over the circuit pattern on the first region and the second region. The lower cell stacked structure includes first gate patterns and first insulation layers. The first gate patterns are spaced apart from each other in a vertical direction perpendicular to an upper surface of the substrate, and the first insulation layers are between the first gate patterns in the vertical direction. The first gate patterns extend in a first direction parallel to the upper surface of the substrate, and edges of the first gate patterns along the first direction are step portions having step shape. The upper cell stacked structure is formed on the lower cell stacked structure. The upper cell stacked structure includes second gate patterns and second insulation layers. The second gate patterns are spaced apart from each other in the vertical direction, and the second insulation layers are between the second gate patterns in the vertical direction. The second gate patterns extend in the first direction parallel to the upper surface of the substrate, and edges of the second gate patterns along the first direction are step portions have the step shape. The channel structures pass through the lower cell stacked structure and the upper cell stacked structure in the first region. Each of the channel structures includes a bent portion at a boundary between the lower cell stacked structure and the upper cell stacked structure. The support structure passes through a structure including the upper cell stacked structure and the lower cell stacked structure in the second region and passes through step portion from among the step portions of one of the first and second gate patterns. The support structure includes a first spacer layer having cup shape, first metal patterns, and a second metal pattern filling an inner space of the first spacer layer. Each of the first metal patterns has ring shape surrounding an outer wall of the first spacer layer. The through via contact is spaced apart from the upper cell stacked structure and the lower cell stacked structure. The through via contact extends in the vertical direction and is electrically connected the circuit pattern. The cell contact plugs are respectively on the step portions of the first and second gate patterns. The first metal patterns are disposed at vertical levels of corresponding ones of the first and second gate patterns. The through via contact and the second metal pattern may include a same material.

According to example embodiments, the vertical memory device may include the support structure, so that the vertical memory device may have a stable structure.

BRIEF DESCRIPTION OF THE DRAWINGS

Embodiments of the inventive concepts will be more clearly understood from the following detailed description taken in conjunction with the accompanying drawings, in which.

DESCRIPTION OF EMBODIMENTS

Hereinafter, in the following description a direction substantially perpendicular to an upper surface of the substrate is defined as a vertical direction, and two directions crossing with each other in horizontal directions substantially parallel to the upper surface of the substrate are defined as first and second directions, respectively. In example embodiments, the first and second directions may be perpendicular to each other.

Figure 1:
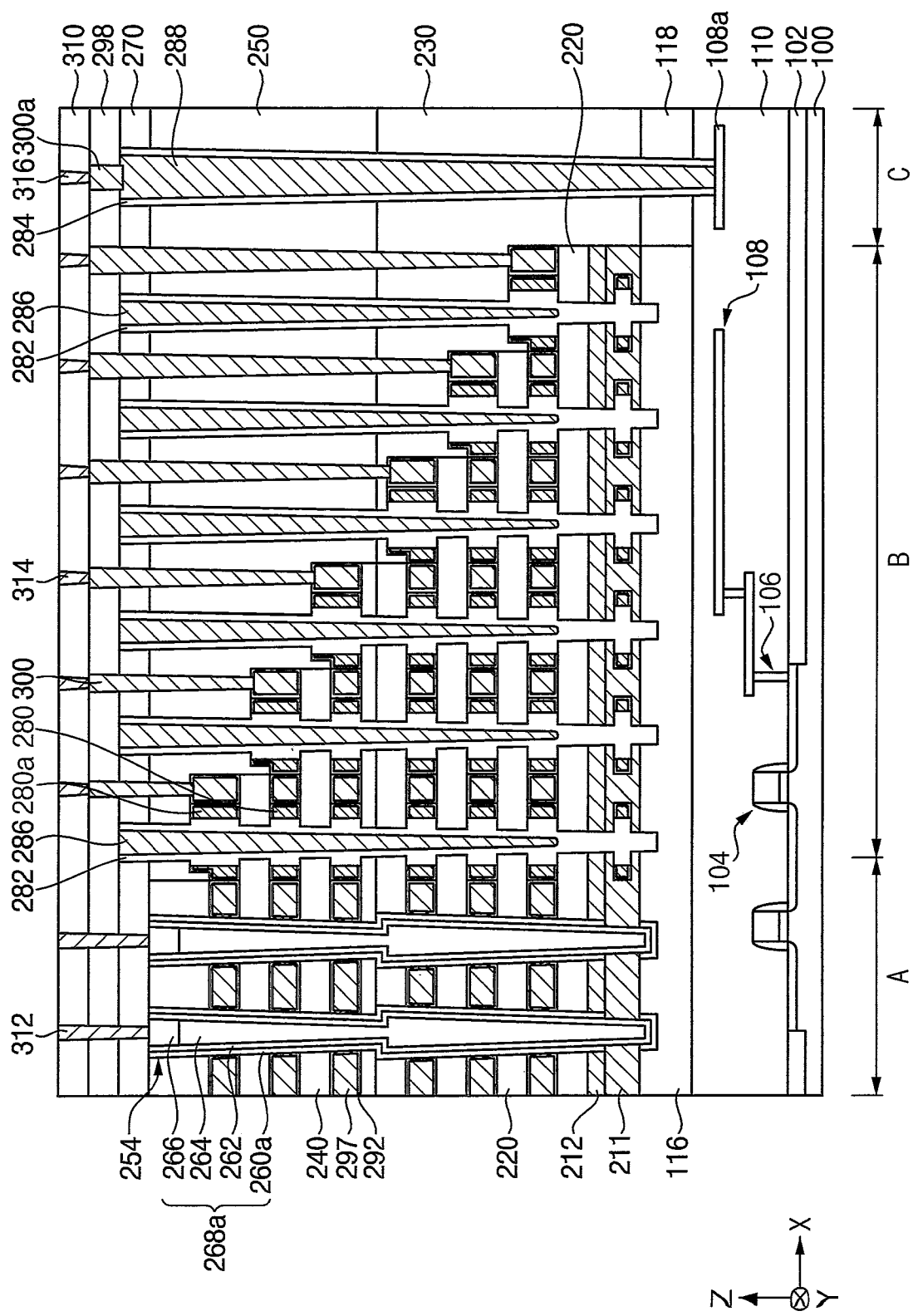
FIG. 1 illustrates a cross-sectional view of a vertical memory device in accordance with embodiments of the inventive concepts.
Figure 2A:
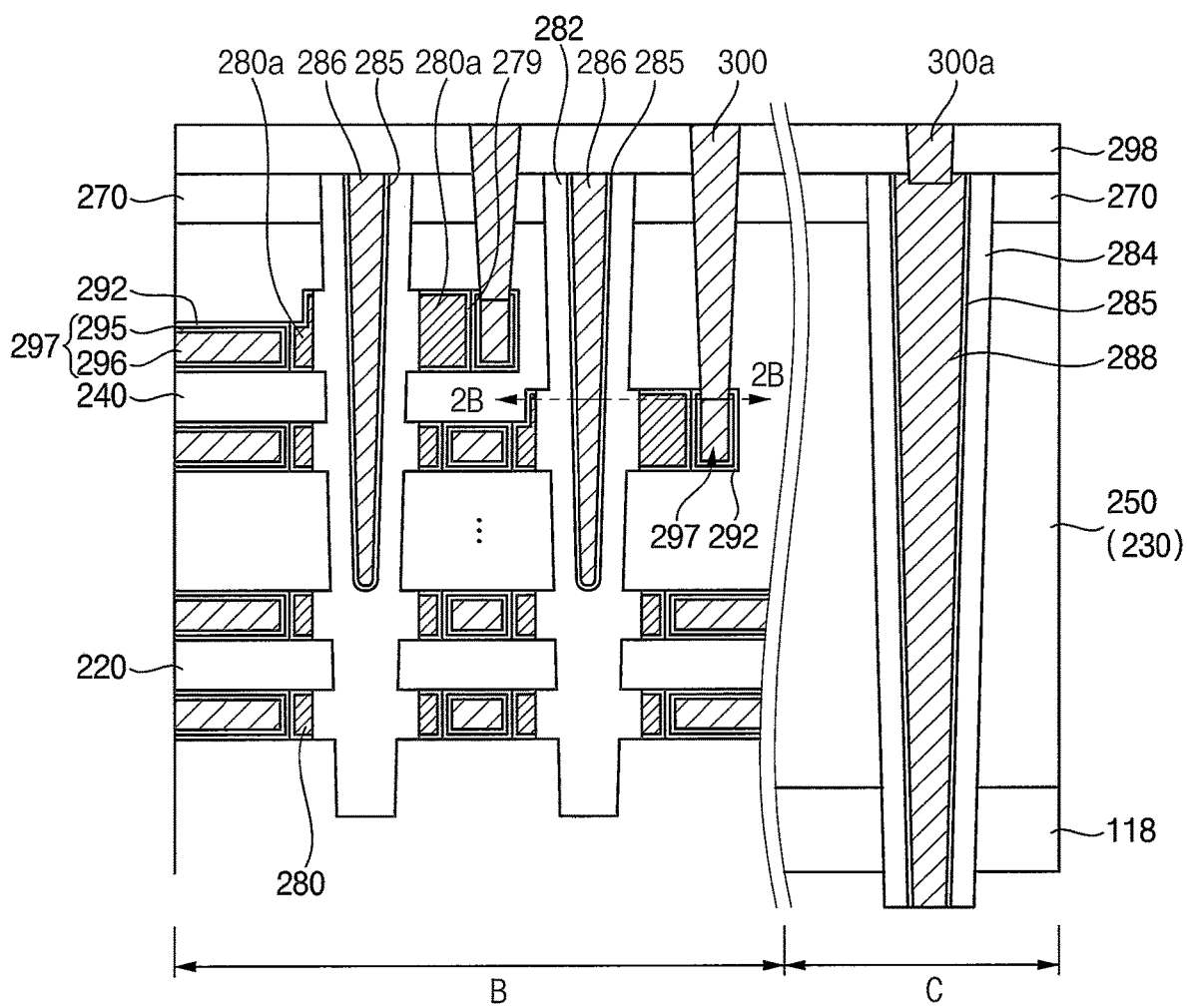
FIG. 2A illustrates an enlarged cross-sectional view of a step portion and a through via hole portion of a vertical memory device in accordance with embodiments of the inventive concepts.
Figure 2B:
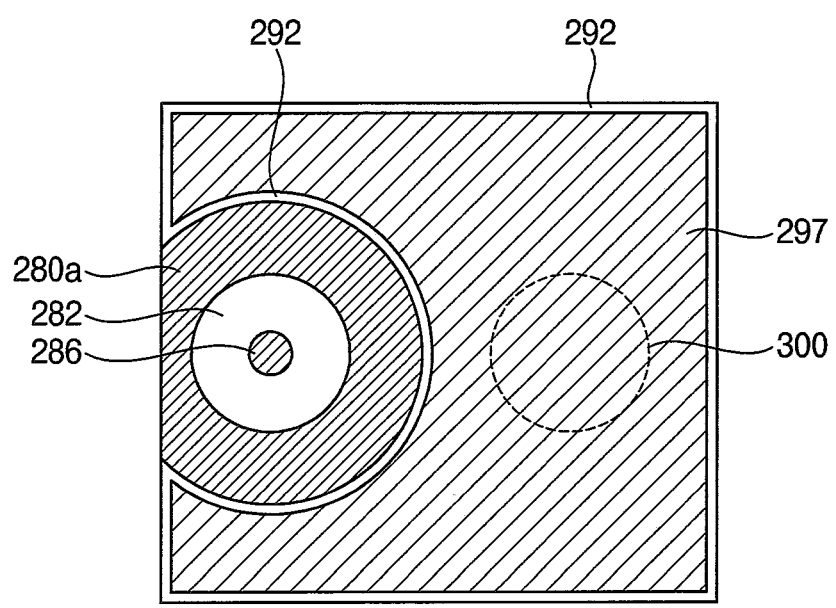
FIG. 2B illustrates a cross-sectional view of the step portion of the vertical memory device of FIG. 2A cut in a horizontal direction.
Figure 3A:
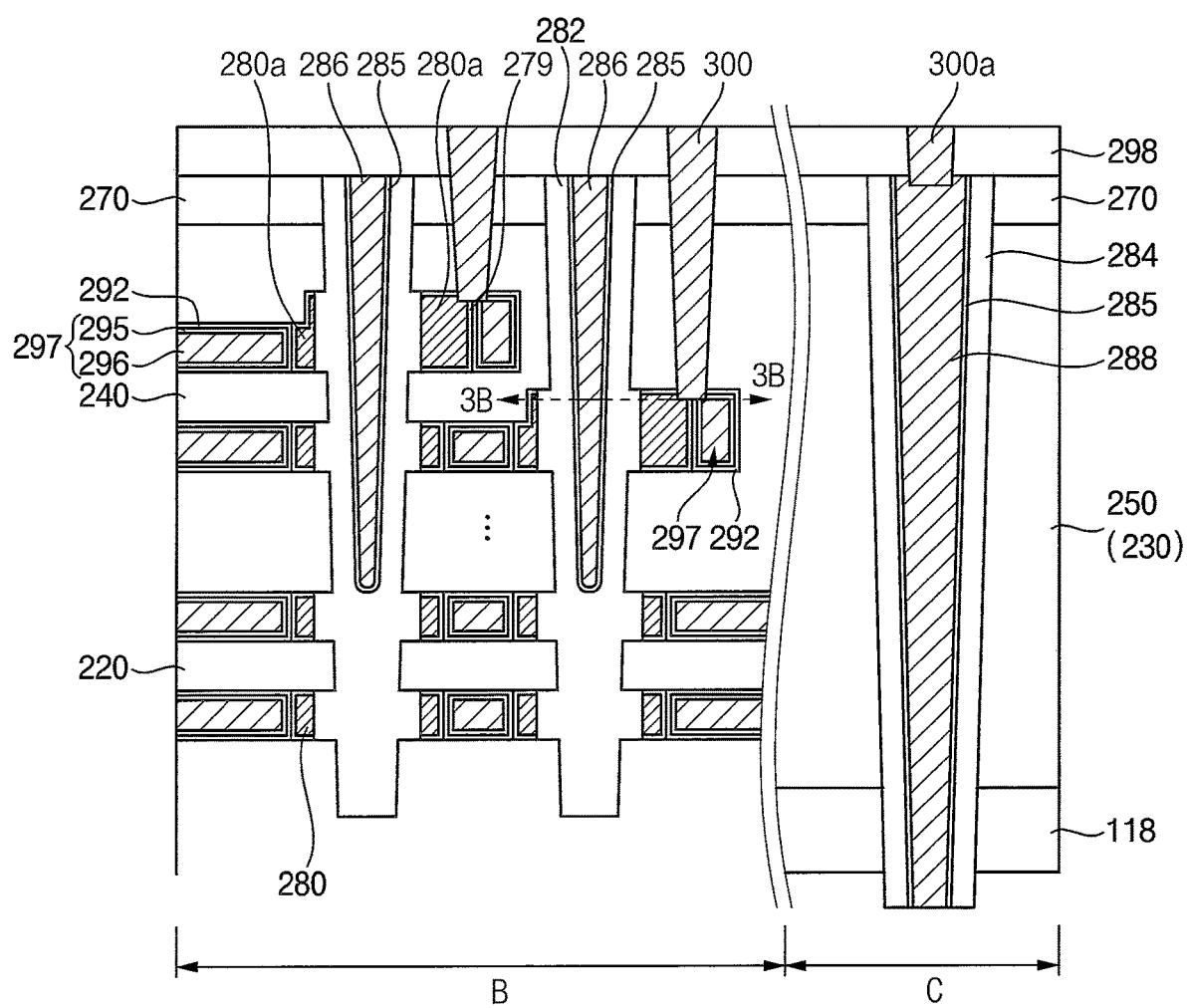
FIG. 3A illustrates an enlarged cross-sectional view of a step portion and a through via hole portion of a vertical memory device in accordance with embodiments of the inventive concepts.

FIG. 1 illustrates a cross-sectional view of a vertical memory device in accordance with embodiments of the inventive concepts. Each of FIGS. 2A and 3A are enlarged cross-sectional views of a step portion and a through via hole portion in a vertical memory device in accordance with embodiments of the inventive concepts. Each of FIGS. 2B and 3B are cross-sectional views of the step portion in the vertical memory devices cut in a horizontal direction respectively along lines 2B-2B and 3B-3B of FIGS. 2A and 3A.

Figure 3B:
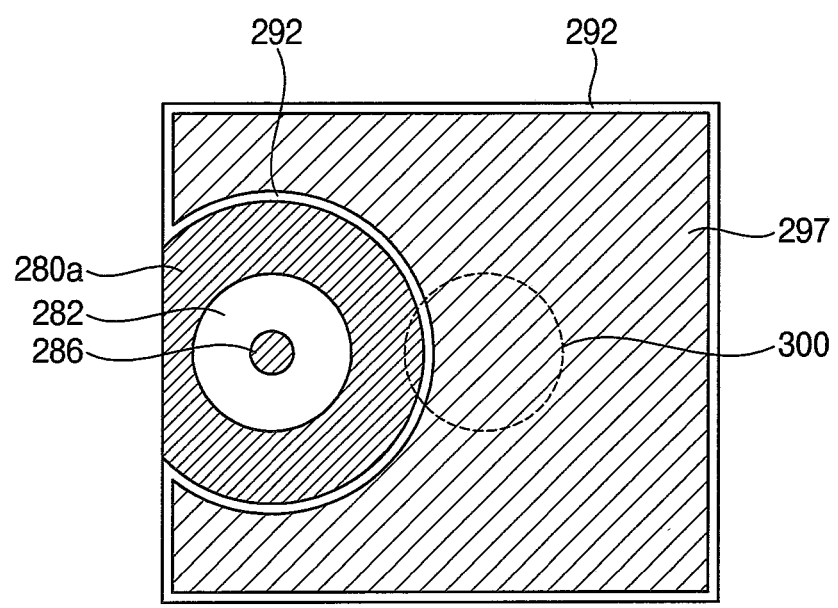
FIG. 3B illustrates a cross-sectional view of the step portion of the vertical memory device of FIG. 3A cut in a horizontal direction.

Referring to FIGS. 1, 2A, and 3B, the vertical memory device may include a circuit pattern formed on a substrate 100, memory cells formed over the circuit pattern, and a wiring electrically connecting the circuit pattern and the memory cells.

The substrate 100 may include a semiconductor material such as for example silicon, germanium, or silicon-germanium, or III-V group compound such as GaP, GaAs, or GaSb. In some example embodiments, the substrate 100 may be a silicon-on-insulator (SOI) substrate or a germanium-on-insulator (GOI) substrate.

The substrate 100 may include a first region A, a second region B and a third region C. The first and second regions A and B may be memory cell regions. Particularly, the first region A may be a region in which a memory cell array is formed, and the second region B may be an extension region extending from the memory cell array. The second region B may be a region in which cell pads of gate patterns are positioned. The third region C may be a region in which through via contacts connected to lower peripheral circuits are formed. Each of the first to third regions A, B, and C may include an upper surface of the substrate 100 and a portion extending in the vertical direction Z from the upper surface of the substrate 100.

In example embodiments, the vertical memory device may have a cell over peripheral (COP) structure. That is, peripheral circuits for driving the memory cell may be formed on the substrate 100 under the memory cells. The circuit pattern may serve as the peripheral circuits. An isolation pattern 102 may be formed in the substrate 100.

The circuit pattern may include lower transistors 104, lower contact plugs 106, lower wirings 108, or the like. In example embodiments, the lower contact plugs 106 and the lower wirings 108 may be formed in multiple layers.

A lower insulating interlayer 110 may be formed on the substrate 100 to cover the circuit pattern. One or more of the lower contact plugs 106 may contact impurity regions, and although not shown, one or more of the lower contact plugs 106 may contact a gate of the lower transistor 104.

Some of the lower wirings 108 may serve as a lower pad pattern 108a connected to a through via contact 288 as will be subsequently described. In example embodiments, the lower pad pattern(s) 108a may be one or more of the lower wirings 108 disposed at an uppermost level.

In example embodiments, the lower pad patterns 108a may be formed in the third region C. However, although not shown, in some example embodiments the through via contact may be further formed in the first and second regions A and B. In this case, the lower pad patterns 108a may also be formed in the first and second regions A and B.

A base pattern 116 may be formed on the lower insulating interlayer 110. In example embodiments, the base pattern 116 may be formed in the first region A and the second region B. The base pattern 116 may include, e.g., a polysilicon layer or a single crystal silicon layer.

A base insulation layer 118 may be formed on the lower insulating interlayer 110 in the third region C. The base insulation layer 118 may include, e.g., silicon oxide. In example embodiments, upper surfaces of the base pattern 116 and the base insulation layer 118 may be substantially coplanar with each other.

A plurality of memory cells may be formed on the base pattern 116. Hereinafter, a structure including the plurality of memory cells may be referred to as a cell stack structure. The cell stack structure may extend in the first direction X. A plurality of cell stacked structures may be arranged in the second direction Y to be apart form each other. A first opening (not shown) extending in the first direction X may be formed between the cell stacked structures. The first opening may be also referred to as a word line cut region.

Hereinafter, a single cell stacked structure will be described. The cell stack structure may include a channel connection pattern 211, a support layer 212, and a cell structure.

The channel connection pattern 211 and the support layer 212 may be formed on the base pattern 116. The channel connection pattern 211 and the support layer 212 may include, e.g., polysilicon.

The cell structure may be formed on the support layer 212. The cell structure may include a lower structure and an upper structure stacked on the lower structure. The lower structure may include first insulation layers 220 and gate patterns 297 alternately stacked. The upper structure may include second insulation layers 240 and the gate patterns 297 alternately stacked.

The first insulation layer 220 and the second insulation layer 240 may include, e.g., silicon oxide. As shown in FIGS. 2A and 3A, the gate pattern 297 may include a third barrier metal pattern 295 and a gate conductive pattern 296. The third barrier metal pattern 295 may be formed on the surface of the gate conductive pattern 296.

In example embodiments, the gate conductive pattern 296 may include a metal material, e.g., tungsten. The third barrier metal pattern 295 may include, e.g., titanium, titanium nitride, tantalum, tantalum nitride, or the like.

A second blocking layer pattern 292 may be formed on a surface of the gate pattern 297. The second blocking layer pattern 292 may include metal oxide, e.g., aluminum oxide.

An edge in the first direction X of the cell structure positioned in the second region B may have a step shape.

Hereinafter, a step portion may be defined as an exposed portion that is not covered by an upper step in a structure having the step shape. An extension portion may be defined as an unexposed portion that is covered by the upper step in the structure having the step shape.

In the cell structure in the second region B, an upper surface of the step portion of the gate pattern 297 positioned at the edge in the first direction X may be higher than an upper surface of the extension portion of the gate pattern 297 connected thereto. In the cell structure in the second region, a lower surface of the step portion of the gate pattern 297 and a lower surface of the extension portion of the gate pattern 297 connected thereto may be substantially coplanar with each other. Thus, in the cell structure in the second region, a vertical thickness of the step portion of the gate pattern 297 may be greater than a vertical thickness of the extension portion of the gate pattern 297 connected thereto.

A first insulating interlayer 230 and a second insulating interlayer 250 may be formed on the cell structure. In example embodiments, the first and second insulating interlayers 230 and 250 may cover the step portion of the cell structure. The first insulating interlayer 230 may cover the step portion of the lower structure, and the second insulating interlayer 250 may cover the step portion of the upper structure. The first and second insulating interlayers 230 and 250 may include, e.g., silicon oxide.

Channel holes 254 may pass through the cell structure, the support layer 212 and the channel connection pattern 211 in the first region, and the channel holes 254 may expose an upper portion of the base pattern 116. The channel hole 254 may include a lower channel hole passing through the lower structure, the support layer 212 and the channel connection pattern 211, and an upper channel hole passing through the upper structure and in communication with (i.e., connected with) the lower channel hole. Each of the lower channel hole and the upper channel hole may have a side wall slope such that a diameter may be gradually decreased from a top to a bottom. That is, in each of the lower channel hole and the upper channel hole, a lower diameter may be smaller than an upper diameter. In example embodiments, an upper diameter of the lower channel hole may be greater than a lower diameter of the upper channel hole. Thus, each of the channel holes 254 may include a bent portion having a bent shape at a boundary between the lower channel hole and the upper channel hole.

A channel structure 268a may include a charge storage structure 260a, a channel 262, a filling insulation pattern 264, and a capping pattern 266.

For example, the channel 262 may extend to the upper portion of the base pattern 116, and the channel 262 may have a cup shape. The charge storage structure 260a may surround an outer wall of the channel 262. The charge storage structure 260a may include a tunnel insulation pattern, a charge storage pattern, and a first blocking layer pattern sequentially stacked on the outer wall of the channel 262. The first blocking layer pattern may contact a second blocking layer pattern 292.

The channel connection pattern 211 may directly contact a lower portion of the channel 262. Therefore, the channels 262 disposed in the channel holes 254 may be electrically connected to each other by the channel connection pattern 211. The charge storage structure 260a may be formed above and below the channel connection pattern 211. The charge storage structure 260a may cut by the channel connection pattern 211. Thus, upper and lower portions of the charge storage structure 260a may be divided to each other.

The channel 262 may include, e.g., polysilicon. The tunnel insulation pattern may include, e.g., silicon oxide. The charge storage pattern may include, e.g., silicon nitride. The first blocking layer pattern may include, e.g., silicon oxide.

The filling insulation pattern 264 may be formed on the channel 262. The filling insulation pattern 264 may have a pillar shape to fill an inner space of the channel 262. The capping pattern 266 may be formed on the filling insulation pattern 264 and the channel 262, and the capping pattern 266 may include polysilicon. A lower surface of the capping pattern 266 may be higher than an upper surface of an uppermost gate pattern 297. In example embodiments, an upper surface of the capping pattern 266 may be coplanar with an upper surface of the second insulating interlayer 250.

A third insulating interlayer 270 may be formed on the cell structure, the channel structure 268a, and the second insulating interlayer 250. The third insulating interlayer 270 may include, e.g., silicon oxide.

A dummy channel hole 272 (refer to FIG. 12) may pass the cell structure, the support layer 212, the channel connection pattern 211, and the first to third insulating interlayers 230, 250, and 270 in the second region, and the dummy channel hole 272 may expose the upper portion of the base pattern 116.

The dummy channel hole 272 may have a side wall slope such that a diameter may be gradually decreased from a top to a bottom. An uppermost portion of the dummy channel hole 272 may have a first upper diameter, and a lower portion of the dummy channel hole 272 may have a first lower diameter smaller than the first upper diameter. The dummy channel hole 272 may not include a bent portion between the lower structure and the upper structure.

A first gap 276a (refer to FIG. 14) and second gaps 276 (refer to FIG. 14) may be positioned on a sidewall of the dummy channel hole 272 to communicate with (i.e., connect with) the dummy channel hole 272. The first gap 276a and the second gaps 276 may be disposed at levels the same as levels of gate patterns 297. The first gap 276a may be disposed adjacent to the step portion of the gate pattern 297, and the second gaps 276 may be disposed on the sidewall of the dummy channel hole 272 under the step portion. That is, the first gap 276a may be an uppermost gap connected with each of the dummy channel holes 272.

In example embodiments, at least a portion of the first gap 276a may have a width in a lateral direction (i.e., horizontal direction) greater than a width in the lateral direction of the second gap 276 positioned below the first gap 276a. In example embodiments, at least a portion of the first gap 276a may have a height greater than a height of the second gap 276 positioned below the first gap 276a.

In example embodiments, the height and the width of the first gap 276a may be different depending on positions within the first gap 276a.

A support structure may be formed at inner portions of the dummy channel hole 272 and the first and second gaps 276a and 276. The support structure may include first metal patterns 280 and 280a, a first spacer layer 282, and a second metal pattern 286.

The first metal patterns 280 and 280a may be formed in only the first and second gaps 276a and 276.

In example embodiments, as shown in FIGS. 2A and 3A, sides of the first metal patterns 280 and 280a may be positioned at an inner side from an inlet of each of the first and second gaps 276a and 276 (that is, the sidewall of the dummy channel hole 272). That is, the first metal patterns 280 and 280a may not protrude from the sidewall of the dummy channel hole 272.

In some example embodiments, the first metal patterns 280 and 280a may fill the first and second gaps 276a and 276 without protruding from the sidewall of the dummy channel hole 272.

In example embodiments, the first metal patterns 280 and 280a may include a metal, e.g., tungsten. A first barrier metal pattern 279 may be further formed on surfaces of the first metal patterns 280 and 280a. The first barrier metal pattern 279 may be conformally formed on the surfaces of the first and second gaps 276a and 276. The first barrier metal pattern 279 may include, e.g., titanium, titanium nitride, tantalum, tantalum nitride, etc.

The first spacer layer 282 may be formed on the sidewall and bottom of the dummy channel hole 272. The first spacer layer 282 may have a cup shape. The first metal patterns 280 and 280a may surround an outer wall of the first spacer layer 282, and each of the first metal patterns 280 and 280a have a ring shape. The first spacer layer 282 may cover an inner sidewall of the first metal pattern 280 and 280a. The first spacer layer 282 may include, e.g., silicon oxide or silicon nitride.

The first spacer layer 282 may be formed along an upper sidewall of the dummy channel hole 272 without filling an upper portion of the dummy channel hole 272. The first spacer layer 282 may fill a lower portion of the dummy channel hole 272. Thus, a thickness of the first spacer layer 282 measured in the vertical direction Z from the bottom of the dummy channel hole 272 may be greater than a thickness of the first spacer layer 282 measured in the vertical direction Z from the sidewall of the dummy channel hole 272. Further, the bottom of the dummy channel hole 272 may not be exposed by the first spacer layer 282.

The second metal pattern 286 may be formed on the first spacer layer 282 to fill the dummy channel hole 272. A second barrier metal layer 285 may be further formed on a sidewall and bottom of the second metal pattern 286. The second metal pattern 286 does not contact the bottom of the dummy channel hole 272 (i.e., the base pattern 116), and the second metal pattern 286 may thus be floated from the bottom of the dummy channel hole 272. Thus, the second metal pattern 286 may be only provided to fill the dummy channel hole 272. The second metal pattern 286 may not be electrically connected to any circuitry and may not perform any specific electrical functions.

The second metal pattern 286 may include a metal, e.g., tungsten. The second barrier metal layer 285 may include, e.g., titanium, titanium nitride, tantalum, tantalum nitride, or the like.

An upper surface of the support structure may not be coplanar with the upper surface of the channel structure 268a. In example embodiments, the upper surface of the support structure may be higher than the upper surface of the channel structure 268a.

The support structure may support the cell stacked structure so as not to lean or collapse (i.e., to prevent leaning and/or collapse of the cell stacked structure), during a manufacturing process of the vertical memory device. For example, the support structure may prevent the first and second insulation layers 220 and 240 included in the cell stacked structure from leaning downward during the manufacturing process of the vertical memory device.

An upper diameter of the support structure may be maintained so as not to expand. However, a portion of the sidewall of the support structure below the upper diameter may be expanded in a lateral direction by the first metal patterns 280 and 280a. As such, the first metal patterns 280 and 280a may be included in (i.e., or as part of) the support structure, so that the cell stacked structure may be more stably supported by the first metal patterns 280 and 280a without increasing the upper diameter of the dummy channel hole 272.

If the upper diameter of the dummy channel hole 272 is increased, a diameter of a through via hole 274 (see FIG. 12) as will be subsequently described, may also be increased. In such a case, it may be difficult to accurately form the through via hole 274 on the lower pad pattern 108a without misalignment.

The first metal patterns 280 and 280a may include metal, so that upper surfaces of the first metal patterns 280 and 280a may serve as a portion of a cell pad region for forming a cell contact plug as will be subsequently described.

The through via hole 274 may pass through the third insulating interlayer 270, the second insulating interlayer 250, the first insulating interlayer 230, the base insulation layer 118, and the lower insulating interlayer 110 in the third region C. The through via hole 274 may extend to the lower pad pattern 108a from the third insulating interlayer 270 in the vertical direction Z. The through via hole 274 may be spaced apart from the cell stack structure.

The through via hole 274 may have a side wall slope such that a diameter gradually decreases from top to bottom. The through via hole 274 may have a second upper diameter greater than the first upper diameter of the dummy channel hole 272, and a second lower diameter greater than the first lower diameter of the dummy channel hole 272. That is, the diameter of the through via hole 274 may be greater than the diameter of the dummy channel hole 272.

A second spacer 284 may be formed on a sidewall of the through via hole 274. The second spacer 284 may be formed only on the sidewall of the through via hole 274, and may not be formed on a bottom of the through via hole 274.

A through via contact 288 may be formed on the second spacer 284 to fill the through via hole 274. The through via contact 288 may be electrically connected to the circuit pattern.

The second spacer 284 may include a material substantially the same as a material of the first spacer layer 282. The through via contact 288 may include a material substantially the same as the material of the second metal pattern 286. The second barrier metal layer 285 may be further formed on a sidewall and bottom of the through via contact 288, as shown in FIG. 2A for example.

In example embodiments, an upper surface of the support structure and an upper surface of the through via contact 288 may be coplanar with each other. In example embodiments, the upper surface of the support structure and the upper surface of the through via contact 288 may be higher than the upper surface of the channel structure 268a.

In example embodiments, a lower surface of the support structure may not be coplanar with a lower surface of the through via contact 288. In example embodiments, the lower surface of the support structure may be higher than the lower surface of the through via contact 288.

An upper diameter of a structure including the through via contact 288 and the second spacer 284 may be greater than the upper diameter of the support structure.

A fourth insulating interlayer 298 may be formed on the third insulating interlayer 270, the channel structure 268a, the support structure, the second spacer 284, and the through via contact 288.

A cell contact plug 300 may pass through the fourth insulating interlayer 298, the third insulating interlayer 270, the second insulating interlayer 250, and the first insulating interlayer 230 in the second region B, and the cell contact plug 300 may contact the step portion of the gate pattern 297. Further, a first contact plug 300a may pass through the fourth insulating interlayer 298 in the third region C, and may contact the through via contact 288. The cell contact plug 300 may contact at least of an upper surface of the step portion of the gate pattern.

A fifth insulating interlayer 310 may be formed on the fourth insulating interlayer 298, the cell contact plug 300, and the first contact plug 300a.

A second contact plug 312 may pass through the fifth insulating interlayer 310, the fourth insulating interlayer 298, and the third insulating interlayer 270 in the first region A, and the second contact plug 312 may contact the capping pattern 266 of the channel structure 268a. A third contact plug 314 and a fourth contact plug 316 may pass through the fifth insulating interlayer 310 in the second and third regions B and C. The third contact plug 314 may contact the cell contact plug 300, and the fourth contact plug 316 may contact the first contact plug 300a.

Although not shown, an upper insulating interlayer may be further formed on the fifth insulating interlayer 310. Upper wirings may pass through the upper insulating interlayer, and the upper wirings may be electrically connected to the second to fourth contact plugs.

Hereinafter, the first metal pattern 280a and the gate pattern 297 included in the support structure will be described in more detail with reference to FIGS. 2A, 2B, 3A and 3B.

FIGS. 2A and 3A are substantially the same as each other, except for a contact region of a bottom of the cell contact plug 300. FIGS. 2B and 3B are substantially the same as each other, except for a contact region of the bottom of the cell contact plug 300.

Referring to FIGS. 2A and 2B, the first metal patterns 280 and 280a included in the support structure may surround the outer wall of the first spacer layer 282. That is, each of the first metal patterns 280 and 280a may have a ring shape.

The first metal patterns 280 and 280a formed on the first spacer layer 282 may be spaced apart from each other in the vertical direction Z. In cross sectional view, a plurality of first metal patterns 280 and 280a formed on the first spacer layer 282 may protrude from the sidewall of the first spacer layer 282, and thus the first metal patterns 280 and 280a and the first spacer layer 282 may have a comb shape.

Each of the first metal patterns 280 and 280a may be disposed at a vertical level the same as a vertical level of each of the gate patterns. The sidewall of each of the first metal patterns 280 and 280a may be adjacent to the sidewall of each of the gate patterns 297 with the second blocking layer pattern 292 therebetween. That is, in the second region, the second blocking layer pattern 292 and the gate pattern 297 may be disposed on the sidewall of each of the first metal patterns 280 and 280a included in the support structure. In example embodiments, the second blocking layer pattern 292 may directly contact the third barrier metal pattern 295 of the gate pattern 297 and the first barrier metal pattern 279 surrounding the first metal patterns 280 and 280a.

The second blocking layer pattern 292 may be disposed at a boundary between the first metal pattern 280 and 280a and the gate pattern 297, so that the first metal pattern 280 and 280a and the gate pattern 297 may be clearly distinguished by the second blocking layer pattern 292.

As shown in FIG. 2A, the vertical thickness of the step portion of the gate pattern 297 may be greater than the vertical thickness of the extension portion of the gate pattern 297 connected thereto. Thus, a vertical thickness of the first metal pattern (i.e., an uppermost first metal pattern 280a) adjacent to the step portion of the gate pattern 297 may be greater than a vertical thickness of the first metal pattern 280 in the extension portion below the step portion. A width of the uppermost first metal pattern 280a may be greater than a width of the first metal pattern 280 in the extension portion below the uppermost first metal pattern 280a. However, in FIG. 1, in order to avoid complexity in the drawing, the width of the uppermost first metal pattern 280a and the width of the first metal pattern 280 in the extension portion below the uppermost first metal pattern 280a are illustrated to be substantially the same.

In example embodiments, the uppermost first metal pattern 280a may be disposed at the step portion and extend continuously in a horizontal direction beyond the step portion. That is, the uppermost first metal pattern 280a may be disposed at the step portion and a portion of the extension portion connected thereto. In this case, the uppermost first metal pattern positioned at the extension portion may have a relatively small vertical thickness and width. Thus, the uppermost first metal pattern 280a may have a different vertical thickness and a different width depending on a position thereof.

The gate pattern 297 may extend in the first direction X. In the second region, the upper surface of the step portion may serve as a cell pad region for forming the cell contact plug 300. In example embodiments, the uppermost first metal pattern 280a, the second blocking layer pattern 292, and the gate pattern 297 may be disposed in the cell pad region.

In example embodiments, as shown in FIGS. 2A and 2B, the cell contact plug 300 may contact the gate pattern 297 in the cell pad region.

In some example embodiments, as shown in FIGS. 3A and 3B, the cell contact plug 300 may contact the gate pattern 297, the second blocking layer pattern 292, and the uppermost first metal pattern 380a in the cell pad region.

A bottom of the cell contact plug 300 may contact at least the gate pattern 297. Further, the bottom of the cell contact plug 300 may also contact the uppermost first metal pattern 280a. Therefore, a contact region of the cell contact plug 300 may sufficiently increase.

The vertical memory device may include the support structure at the step portion of the cell stacked structure in the second region. Thus, the cell stacked structure may be may stably supported by the support structure. Particularly, the support structure may include the first metal patterns 280 and 280a surrounding the outer wall of the first spacer layer 282 and having the ring shape. Thus, the cell stacked structure may be more stably supported without increasing the upper diameter of the dummy channel hole 272.

Figure 4A:
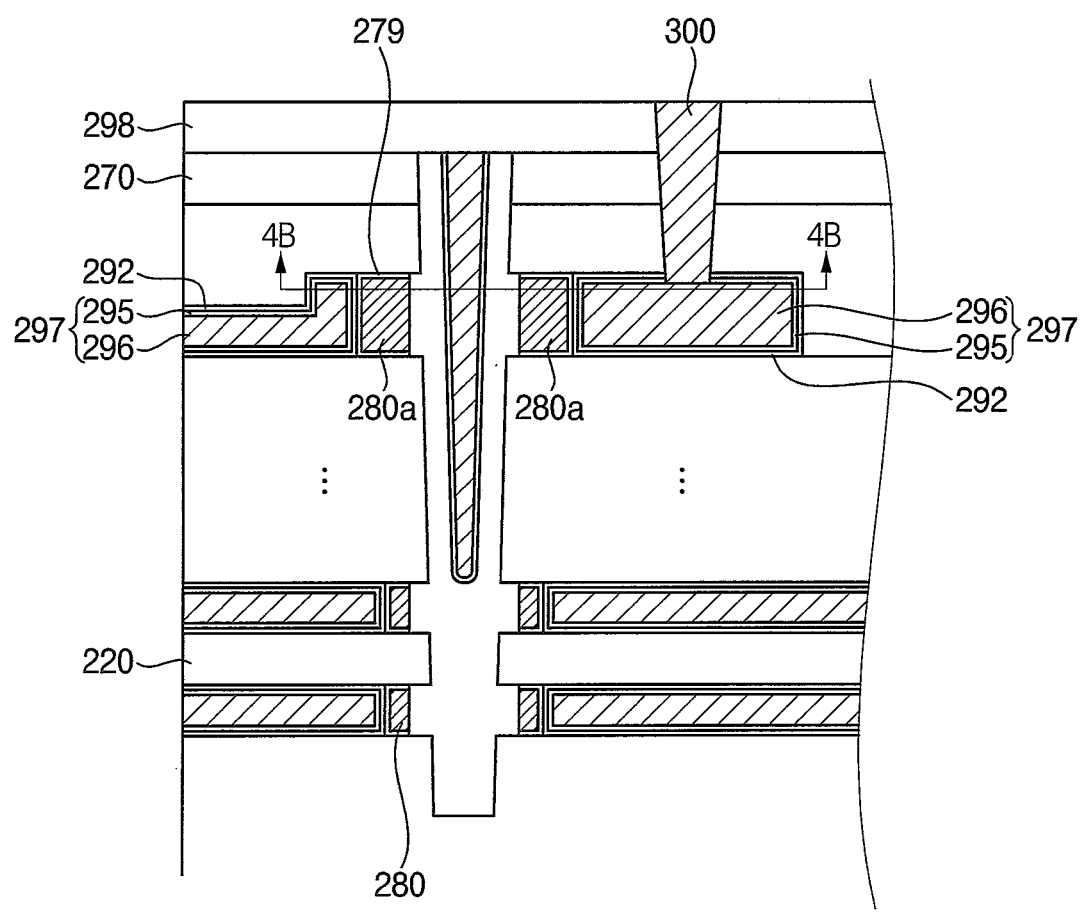
FIG. 4A illustrates an enlarged cross-sectional view of a step portion of a vertical memory device in accordance with embodiments of the inventive concepts.
Figure 4B:
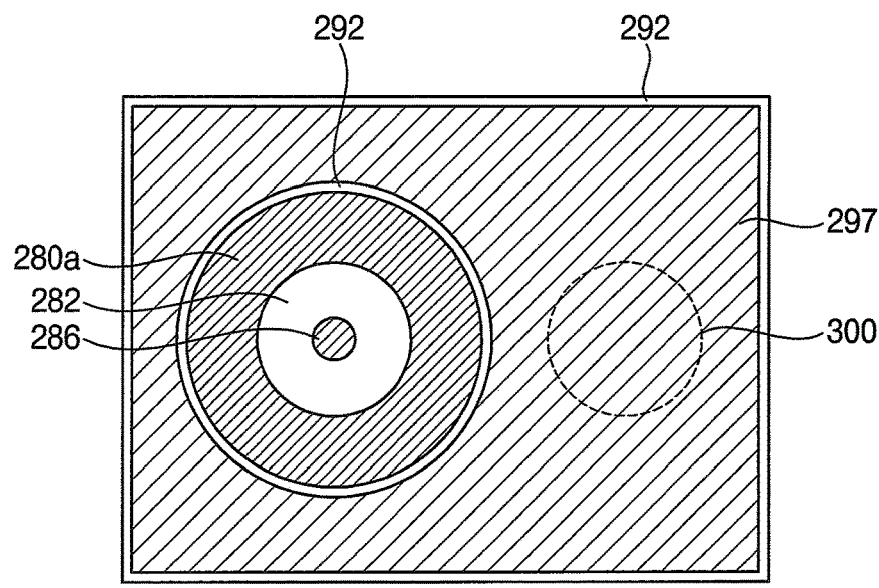
FIG. 4B illustrates a cross-sectional view of the step portion in the vertical memory device of FIG. 4A cut in a horizontal direction.

FIG. 4A illustrates an enlarged cross-sectional view of a step portion in a vertical memory device in accordance with embodiments of the inventive concepts. FIG. 4B illustrates a cross-sectional view of the step portion of the vertical memory device cut in a horizontal direction along line 4B-4B of FIG. 4A.

The vertical memory device as shown in FIG. 4A may be substantially the same or similar to the vertical memory device illustrated with reference to FIGS. 1, 2A, 2B, 3A, and 3B, except for the shape of the support structure.

Referring to FIGS. 4A and 4B, the step portion may be sufficiently wide. Thus, the first gap 276a (see FIG. 14A) that communicates with (i.e., connects with) the sidewall of the dummy channel hole 272 may be formed by etching silicon nitride of the step portion. That is, the first gap 276a may be formed only in the step portion, and the first gap 276a may not extend to the extension portion beyond the step portion.

The first metal pattern (i.e., an uppermost first metal pattern 280a) formed in the first gap 276a may have a vertical thickness greater than a vertical thickness of the extension portion of the gate pattern 297 connected to the uppermost first metal pattern 280a. Further, a width of the uppermost first metal pattern 280a may be greater than a width of the first metal pattern 280 in the extension portion below the uppermost first metal pattern 280a.

The first metal patterns 280 and 280a may surround the first spacer layer to have a ring shape. The uppermost first metal pattern 280a may have the same height and the same width depending on a position thereof.

Figure 5:
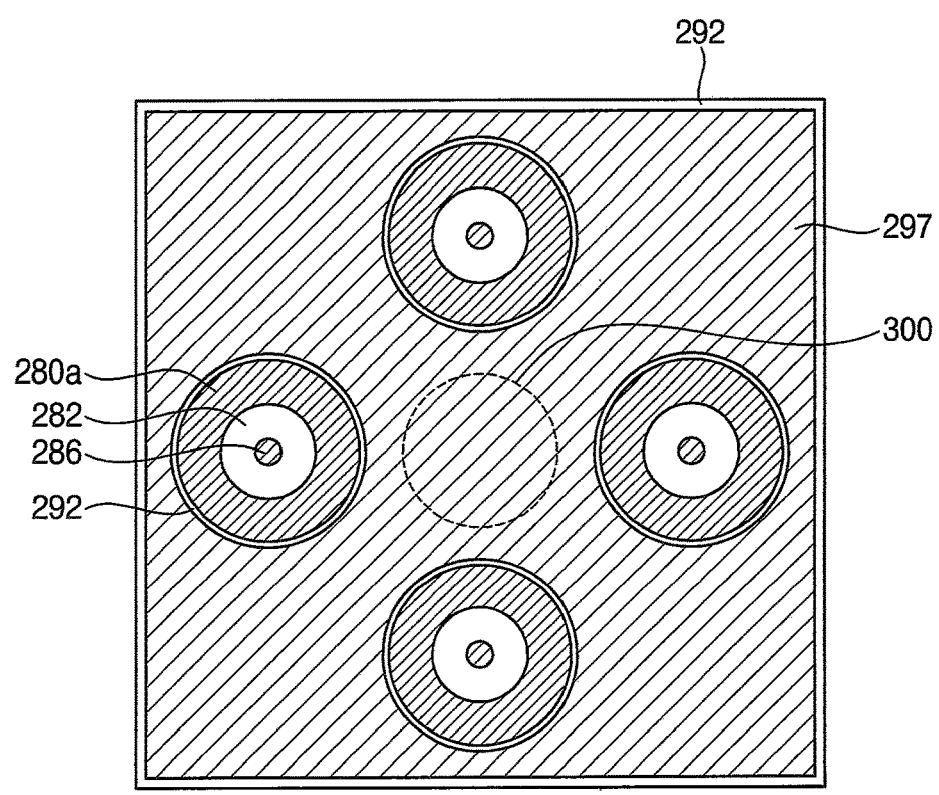
FIG. 5 illustrates a cross-sectional view of a step portion of a vertical memory device cut in a horizontal direction in accordance with embodiments of the inventive concepts.

FIG. 5 illustrates a cross-sectional view of a vertical memory device cut in a horizontal direction of the step portion in accordance with embodiments of the inventive concepts.

The vertical memory device of FIG. 5 may be substantially the same or similar to the vertical memory device illustrated with reference to FIGS. 1, 2A, 2B, 3A, 3B, 4A and 4B, except for the number of the support structures.

Referring to FIG. 5, a plurality of support structures may be formed on each of the step portions. In example embodiments, the plurality of support structures may pass through one of step portions, and the plurality of support structures may be spaced apart from the cell contact plug 300.

Each of the support structures may be substantially the same as the support structure illustrated with reference to FIGS. 1, 4A and 4B.

FIGS. 6 to 25 illustrate cross-sectional views explanatory of a method of manufacturing a vertical memory device in accordance with embodiments of the inventive concepts.

Particularly, FIGS. 13, 14, 15, 17, 19, 21, and 23 are enlarged cross-sectional views illustrating a step portion and a through via hole portion in a vertical memory device in accordance with example embodiments.

Figure 6:
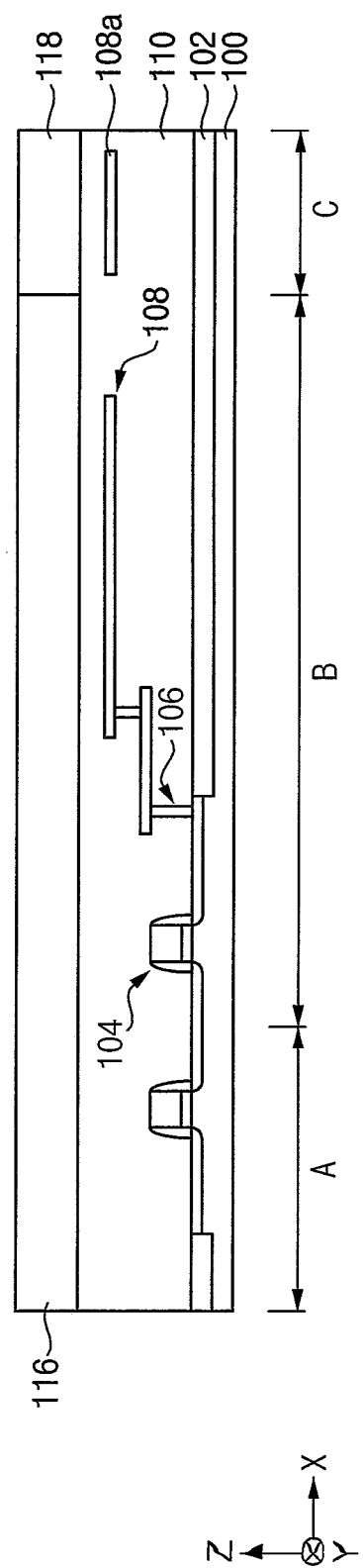
FIGS. 6, 7, 8, 9, 10, 11, 12, 13, 14, 15, 16, 17, 18, 19, 20, 21, 22, 23, 24 and 25 illustrate cross-sectional views explanatory of a method of manufacturing a vertical memory device in accordance with embodiments of the inventive concepts.

Referring to FIG. 6, a circuit pattern constituted of peripheral circuits may be formed on a substrate 100. A lower insulating interlayer 110 may be formed to cover the circuit pattern.

Particularly, a shallow trench isolation process may be performed on the substrate 100, so that a field region in which an isolation pattern 102 is formed and an active region in which the isolation pattern 102 is not formed may be provided. Lower transistors 104, lower contact plugs 106, lower wirings 108, and or like may be formed on the substrate 100.

Some of the lower wirings 108 may serve as a lower pad pattern 108a to be connected to a through via contact as will be subsequently described. Although not shown, the lower contact plugs 106 and the lower wirings 108 may be formed in multiple layers.

A base pattern 116 may be formed on the lower insulating interlayer 110 in the first and second regions A and B. A base insulation layer 118 may be formed on the lower insulating interlayer 110 in the third region C.

Figure 7:
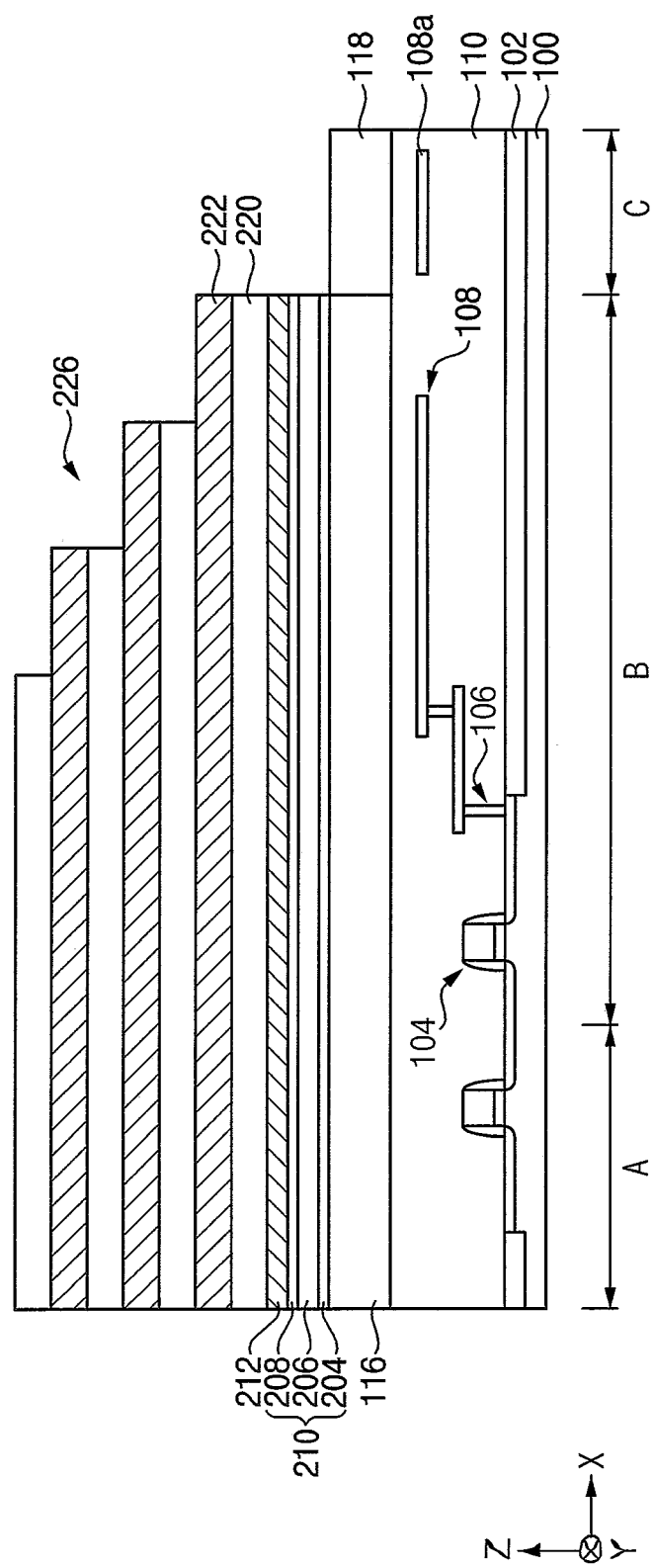

Referring to FIG. 7, a lower sacrificial layer structure 210 and a support layer 212 may be formed on the base pattern 116 and the base insulation layer 118. The lower sacrificial layer structure 210 may include first to third lower sacrificial layers 204, 206, and 208 sequentially stacked. In this case, the first and third lower sacrificial layers 204 and 208 may include, e.g., an oxide such as silicon oxide, and the second lower sacrificial layer 206 may include, e.g., a nitride such as silicon nitride. The support layer 212 may be formed of a material having an etching selectivity with respect to the first to third lower sacrificial layers 204, 206, and 208. For example, the support layer 212 may include undoped polysilicon, or polysilicon doped with n-type impurities. Although not shown, a portion of the support layer 212 may pass through the lower sacrificial layer structure 210, and may contact the upper surface of the base pattern 116.

First insulation layers 220 and first sacrificial layers 222 may be alternately and repeatedly stacked on the support layer 212. The first insulation layer 220 may include, e.g., silicon oxide. The first sacrificial layer 222 may include a material having an etch selectivity with respect to the first insulation layer 220. The first sacrificial layer 222 may include a nitride, e.g., silicon nitride.

The first insulation layers 220, the first sacrificial layers 222, the support layer 212 and the lower sacrificial layer structure 210 may be patterned to form a first preliminary mold structure 226 having a step shape in the second region B.

In example embodiments, each of step portions of the first preliminary mold structure 226 may have a structure in which the first insulation layer 220 and the first sacrificial layer 222 are stacked. In example embodiments, the first sacrificial layer 222 may be exposed on each of the step portions of the first preliminary mold structure 226.

Figure 8:
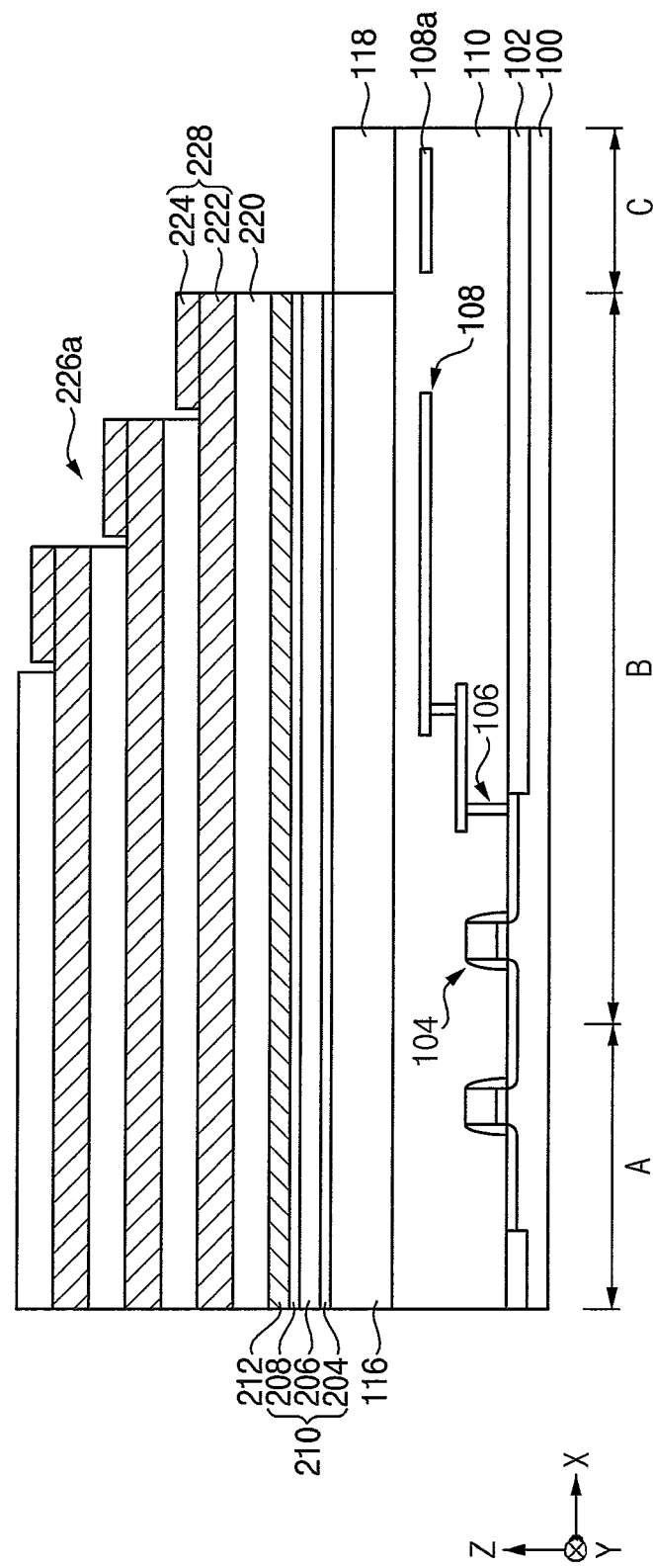

Referring to FIG. 8, a first sacrificial pattern 224 may be formed on each of the step portions of the first preliminary mold structure 226 to form a first mold structure 226a. The first sacrificial layer 222 and the first sacrificial pattern 224 may be formed of substantially the same material. In each of the step portions of the first mold structure 226a, the first sacrificial layer 222 and the first sacrificial pattern 224 may serve as a first sacrificial structure 228.

In the first mold structure 226a of the second region B, the extension portion may have a structure including the first insulation layer 220 and the first sacrificial layer 222 stacked sequentially, and the step portion may have the first insulation layer 220, the first sacrificial layer 222 and the first sacrificial pattern 224 stacked sequentially. Thus, the step portion may have a thickness greater than a thickness of other portion (i.e., the extension portion). An upper surface of the step portion may be higher than an upper surface of the other portion.

Figure 9:
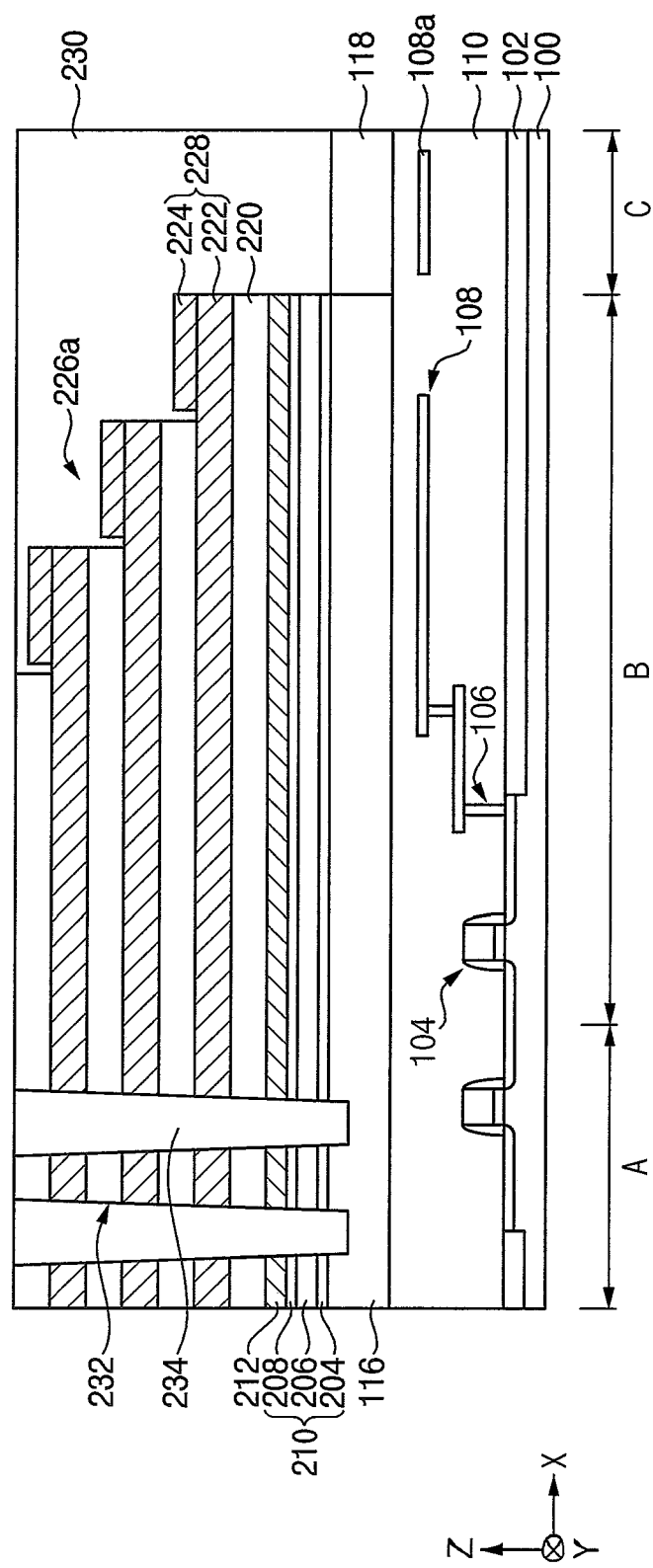

Referring to FIG. 9, an insulation layer may be formed to cover the first mold structure 226a. An upper surface of the insulation layer may be planarized to form a first insulating interlayer 230.

Lower channel holes 232 may be formed through the first mold structure 226a in the first region, and the lower channel holes 232 may extend to the base pattern 116. A filling sacrificial layer 234 may formed in the lower channel holes 232.

Figure 10:
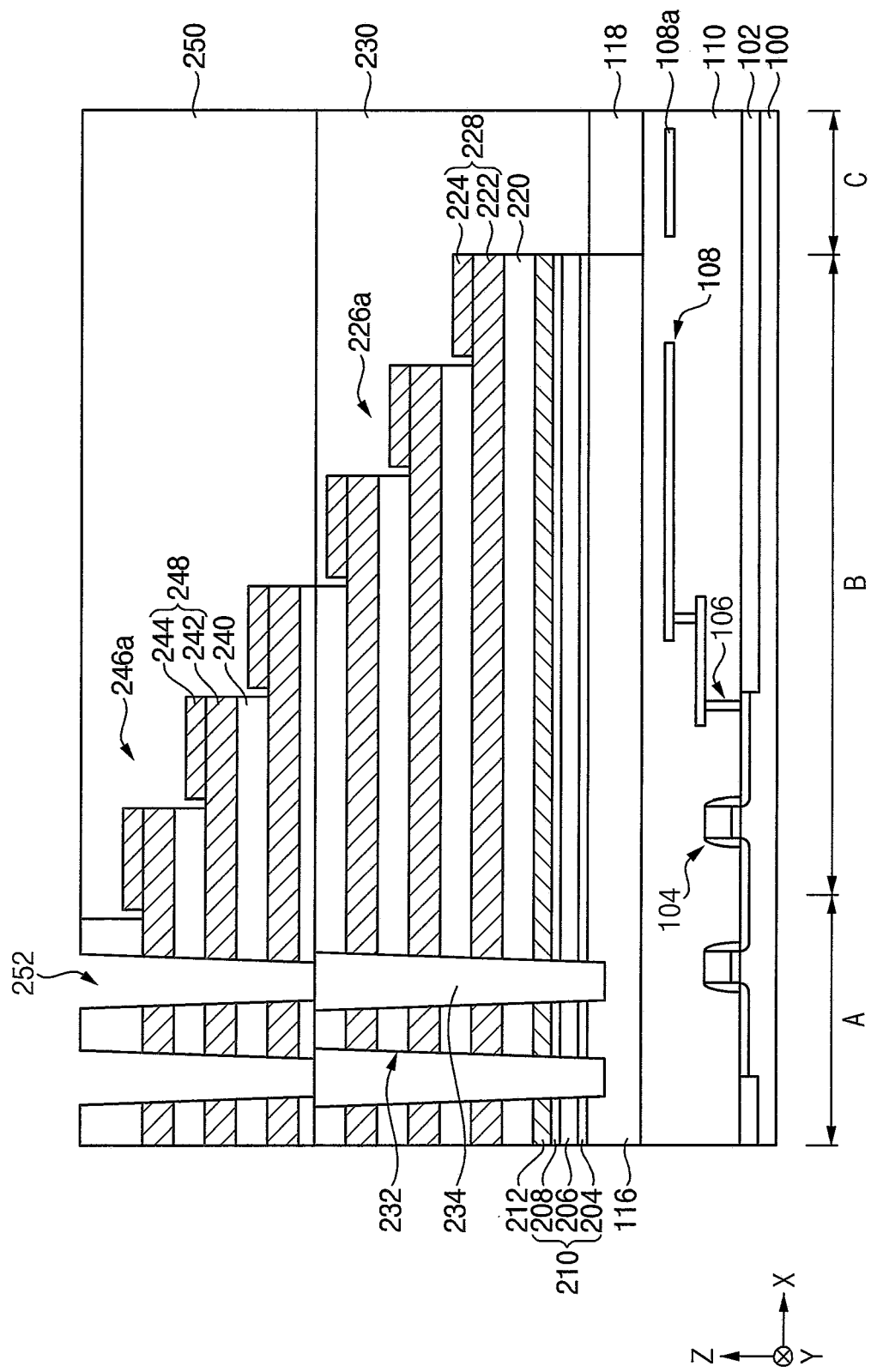

Referring to FIG. 10, second insulation layers 240 and second sacrificial layers 242 may be alternately and repeatedly stacked on the first mold structure 226a, the filling sacrificial layer 234, and the first insulating interlayer 230.

The second insulation layers 240 and the second sacrificial layers 242 may be patterned to form a second preliminary structure. In the second region B, the second preliminary structure may have a step shape connected from the first mold structure 226a.

A second sacrificial pattern 244 may be formed on each of the step portions of the second preliminary mold structure to form a second mold structure 246a. The second sacrificial layer 242 and the second sacrificial pattern 244 may be formed of substantially the same material. In each of step portions of the second mold structure 246a, the second sacrificial layer 242 and the second sacrificial pattern 244 may serve as a second sacrificial structure 248.

An insulation layer may be formed to cover the second mold structure 246a. An upper surface of the insulation layer may be planarized to form a second insulating interlayer 250.

Thereafter, an upper channel hole 252 may be formed through the second mold structure 246a in the first region A. The upper channel hole 252 may be formed to communicate with the lower channel hole 232.

Figure 11:
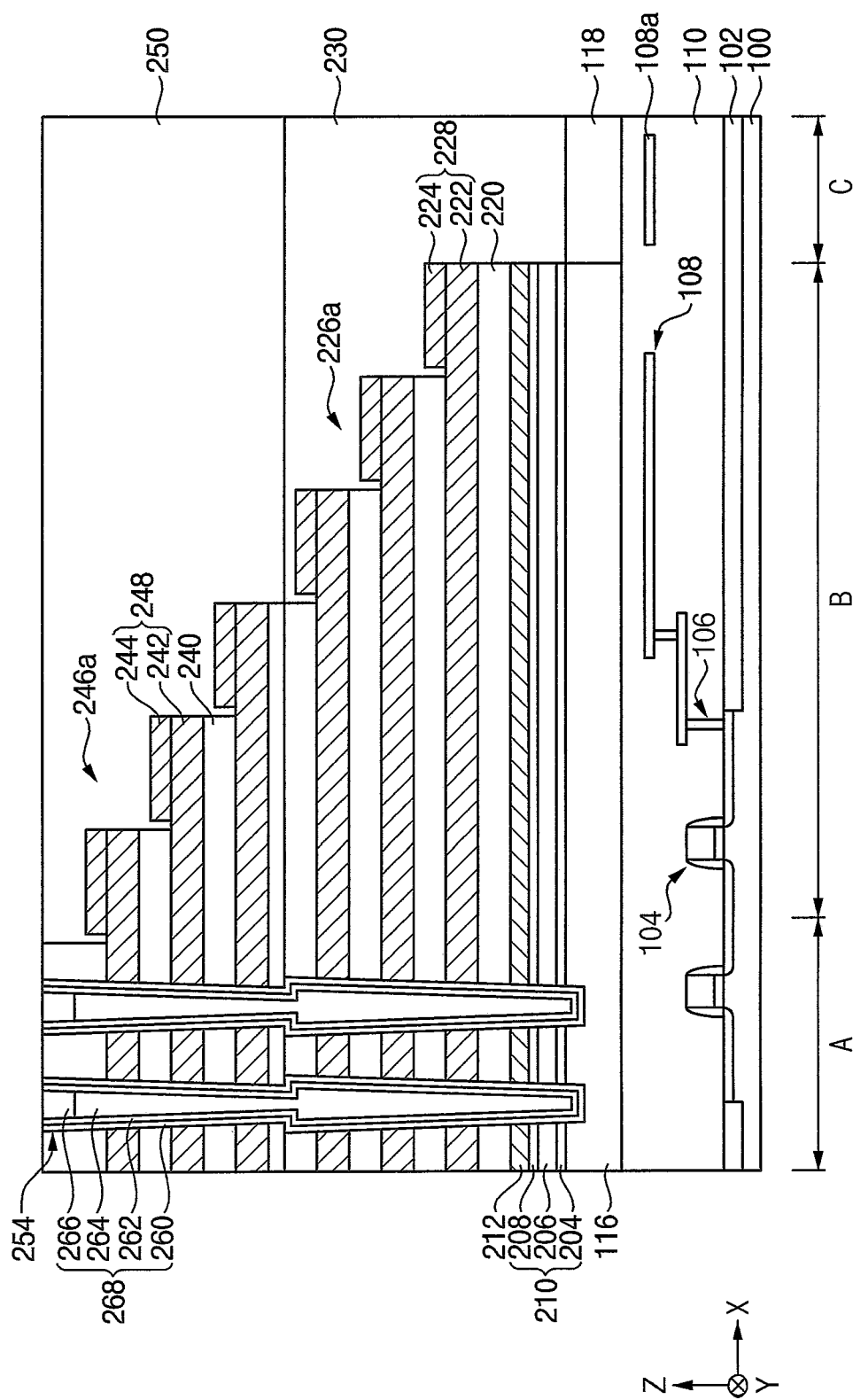

Referring to FIG. 11, the filling sacrificial layer 234 filling the lower channel hole 232 may removed to form a channel hole 254. The channel hole 254 may include the lower channel hole 232 and the upper channel hole 252 communicated with (i.e., connected with) each other.

A preliminary channel structure 268 may be formed in the channel hole 254. In example embodiments, the preliminary channel structure 268 may include a preliminary charge storage structure 260, a channel 262, a filling insulation pattern 264, and a capping pattern 266. The preliminary charge storage structure 260 may include a preliminary first blocking layer, a preliminary charge storage layer, and a preliminary tunnel insulation layer sequentially stacked from a sidewall of the channel hole 254.

The subsequent processes will be described with reference to enlarged cross-sectional views of the step portion and a through via hole portion.

Figure 12:
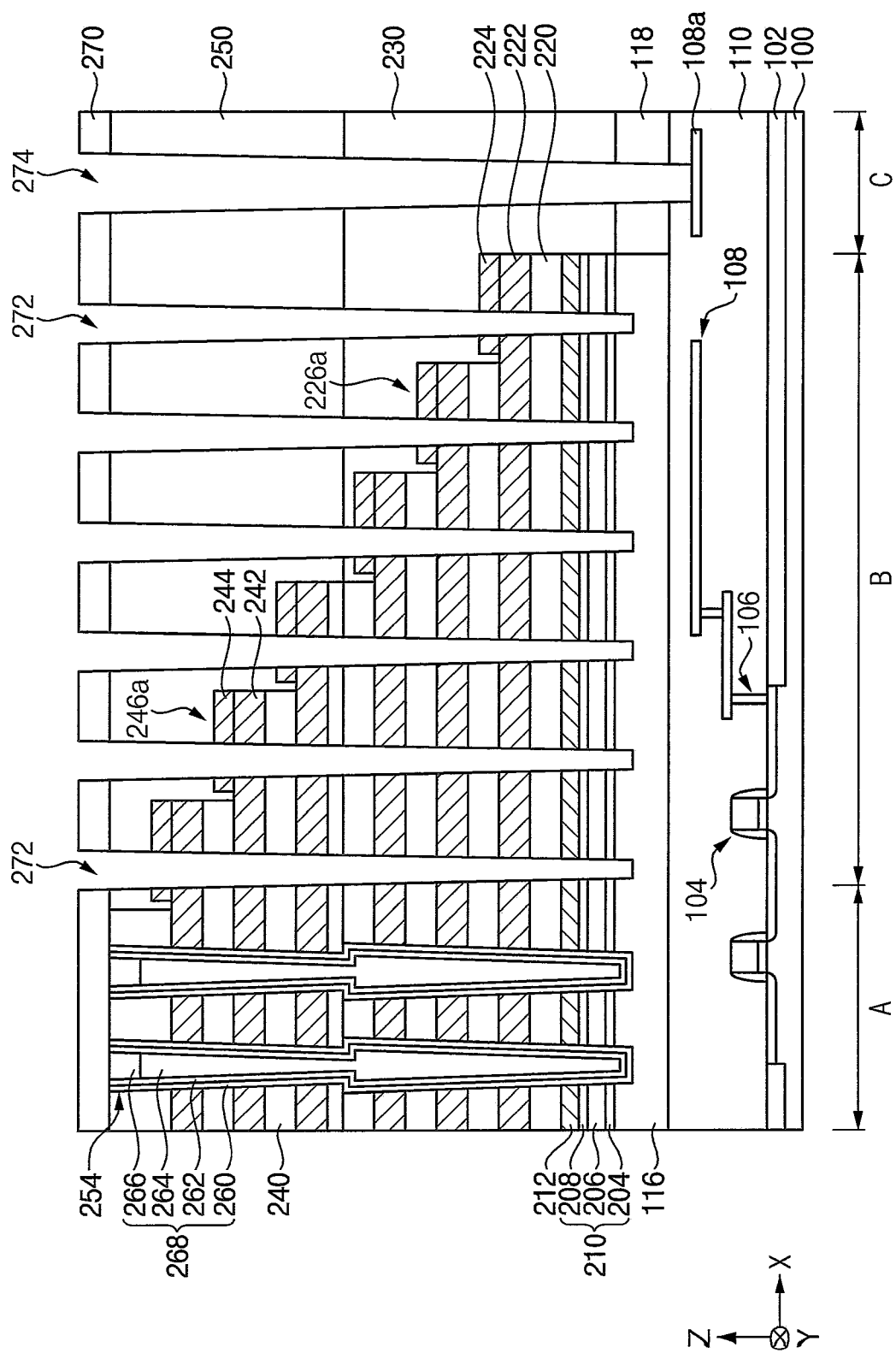
Figure 13:
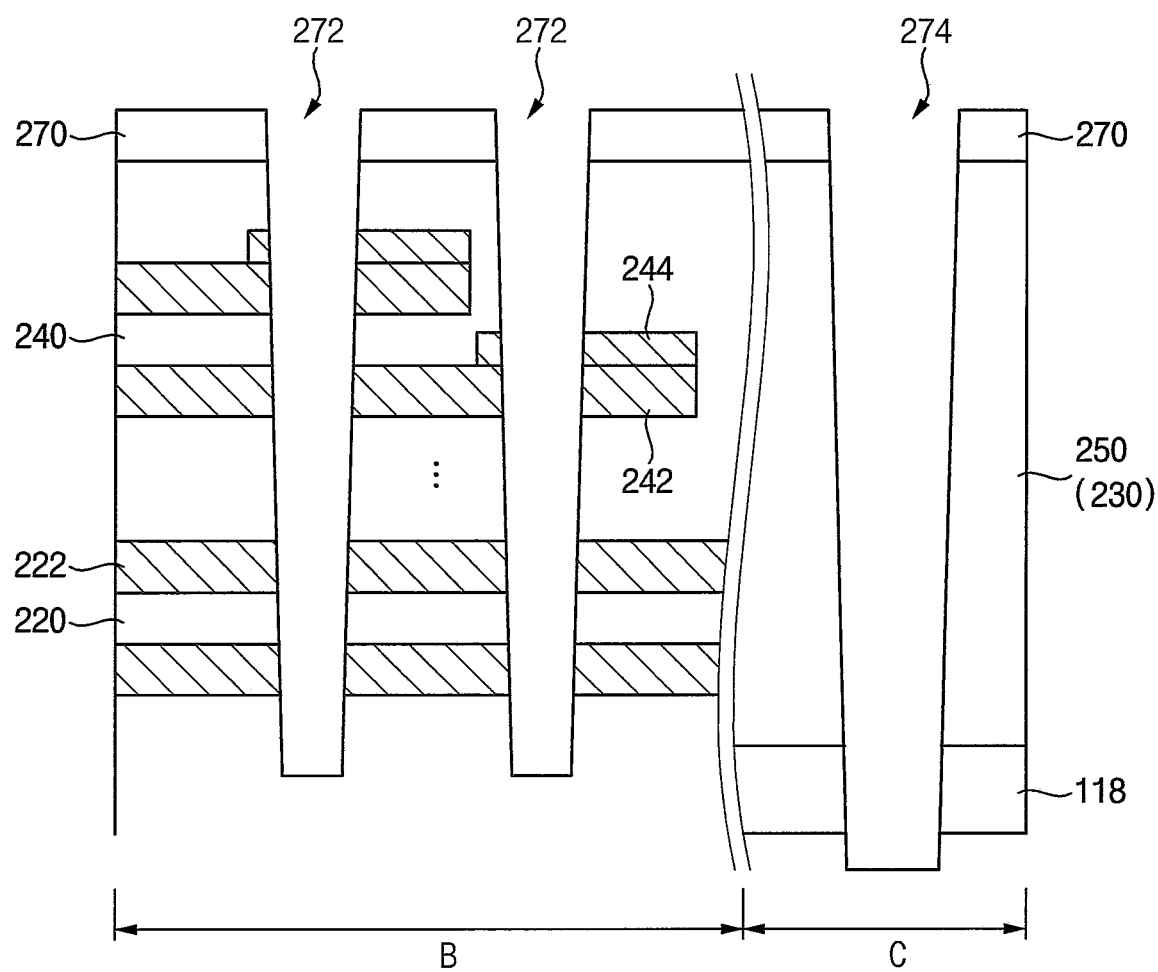

Referring to FIGS. 12 and 13, a third insulating interlayer 270 may be formed on the second insulating interlayer 250 and the preliminary channel structure 268.

Dummy channel holes 272 may be formed through the third insulating interlayer 270, the second insulating interlayer 250, the first insulating interlayer 230, the first and second mold structures 226a and 246a, the support layer 212, the lower sacrificial layer structure 210 in the second region B. Each of the dummy channel holes 272 may pass through one of the step portions, and may extend to an upper portion of the base pattern 116. In an etching process for forming the dummy channel holes 272, a through via hole 274 may be also formed through the third insulating interlayer 270, the second insulating interlayer 250, the first insulating interlayer 230, the base insulation layer 118 and the lower insulating interlayer 110 in the third region C. The through via hole 274 may extend to an upper surface of the lower pad pattern 108a.

The dummy channel hole 272 may have a sidewall slope such that a diameter gradually decreases from top to bottom. The through via hole 274 may have a sidewall slope such that a diameter gradually decreases from top to bottom.

The dummy channel hole 272 may have a first upper diameter and a first lower diameter. The through via hole 274 may have a second upper diameter greater than the first upper diameter, and a second lower diameter greater than the first lower diameter. The through via hole 274 may have a diameter greater than a diameter of the dummy channel hole 272, as an etch rate of a portion through which the through via hole 274 is formed may be higher than an etch rate of a portion through which the dummy channel hole 272 is formed in the etching process. Therefore, the dummy channel hole 272 and the through via hole 274 having bottoms with different vertical levels along the third direction Z may be simultaneously formed by the same etching process.

The dummy channel hole 272 may be formed to be spaced apart from a cell contact plug subsequently formed.

In example embodiments, the cell contact plug may be close to an edge of the step portion in the first direction X, and the dummy channel hole 272 may be disposed at inner portion of the step portion in which the cell contact plug is formed. That is, the dummy channel hole 272 may be disposed at a position farther from the edge in the first direction X of the step portion than the cell contact plug.

The third insulating interlayer 270, the second insulating interlayer 250, the first insulating interlayer 230, the first insulation layer 220, the first sacrificial layer 222, the second insulation layer 240, the second sacrificial layer 242, the first sacrificial pattern 224, the second sacrificial pattern 244, the support layer 212, the lower sacrificial layer structure 210, and the base pattern 116 may be exposed by a sidewall of the dummy channel hole. The third insulating interlayer 270, the second insulating interlayer 250, the first insulating interlayer 230, the base insulation layer 118, and the lower insulating interlayer 110 may be exposed by a sidewall of the through via hole 274. That is, silicon nitride may not be exposed by the sidewall of the through via hole 274.

Figure 14:
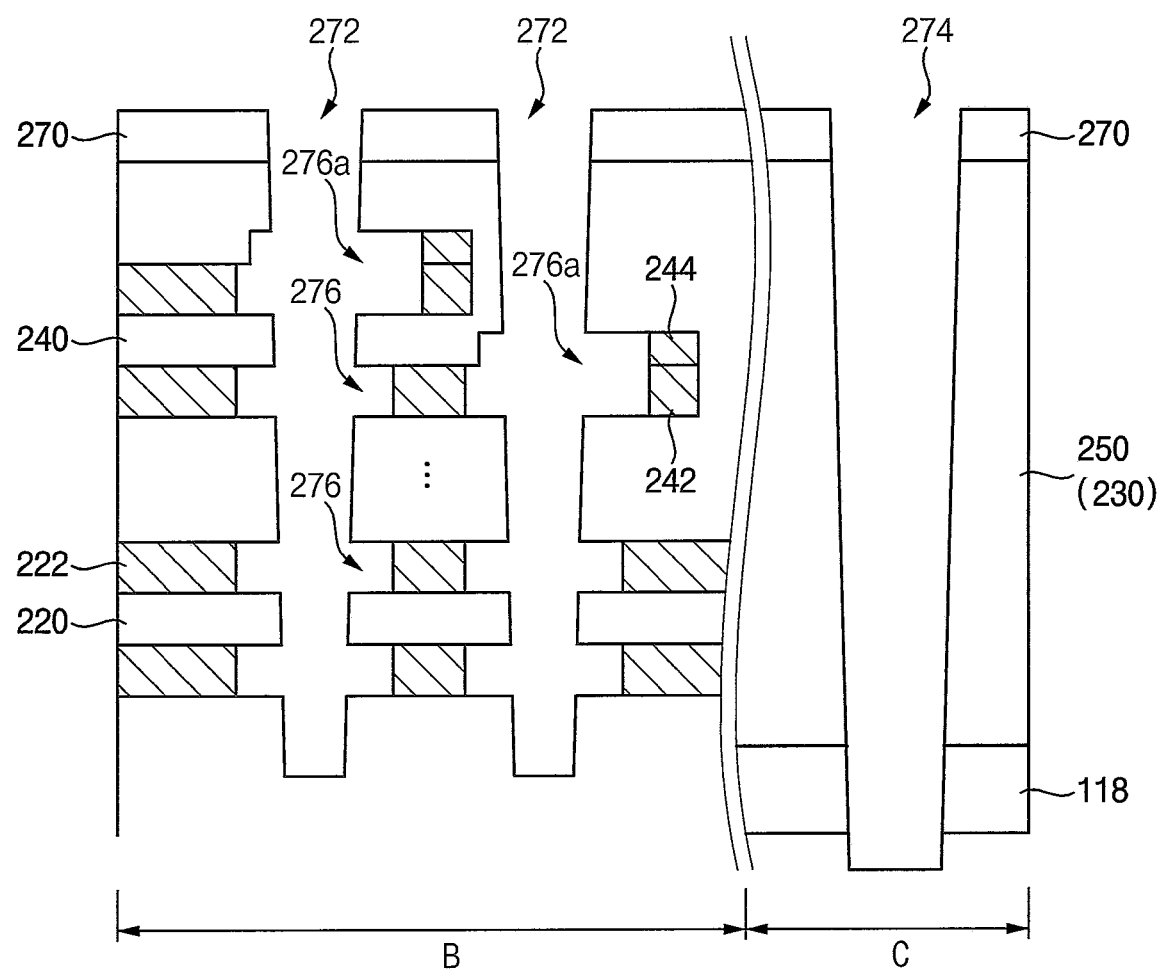

Referring to FIG. 14, the silicon nitride exposed by the sidewall of the dummy channel hole 272 may be partially removed to form a first gap 276a and second gaps 276. The first gap 276a may be an uppermost gap that communicates with (i.e., is connected with) the sidewall of the dummy channel hole 272 in the step portion, and the second gaps 276 may be gaps that communicate with the sidewall of the dummy channel hole 272 under the step portion.

In the removing process, the first sacrificial layer 222, the second sacrificial layer 242, the first sacrificial pattern 224, and the second sacrificial pattern 244 exposed by the sidewall of the dummy channel hole 272 may be partially etched by a predetermined thickness. The etching process may include an isotropic etching process. The isotropic etching process may include, e.g., a wet etching process using hydrofluoric acid (HF) and/or phosphoric acid ($H_3PO_4$).

A thickness of the silicon nitride in the step portion may be greater than a thickness of the silicon nitride in the extension portion, so that the silicon nitride in the step portion may have an etching rate higher than an etching rate of the silicon nitride in the extension portion in the etching process. Therefore, at least a portion of the first gap 276a positioned in the step portion may have a width and a height greater than a width and a height of each of the second gaps 276 positioned below the step portion.

In example embodiments, when the step portion is not wide, the sidewall of the dummy channel hole 272 in the step portion may be close to the extension portion. Therefore, a portion of the first gap 276a may be formed by etching the silicon nitride in a step portion, and the other portion of the first gap 276a may be formed by etching silicon nitride in the extension portion adjacent to the step portion. Thus, the first gap 276a may have different heights and widths depending on the position thereof.

In some example embodiments, when the step portion is sufficiently wide, the sidewall of the dummy channel hole 272 in the step portion may not be close to the extension portion. Thus, the first gap 276a may be formed by only etching the silicon nitride in the step portion. The silicon nitride in the extension portion may not be etched. In this case, the first gap 276a may have the same height and the same width depending on the position thereof. When the step portion is sufficiently wide, a vertical memory device illustrated with reference to FIGS. 4A and 4B may be manufactured by subsequent processes.

Shapes of first metal patterns formed by subsequent processes may be different according to the widths and the heights of the first and second gaps 276a and 276.

Figure 15:
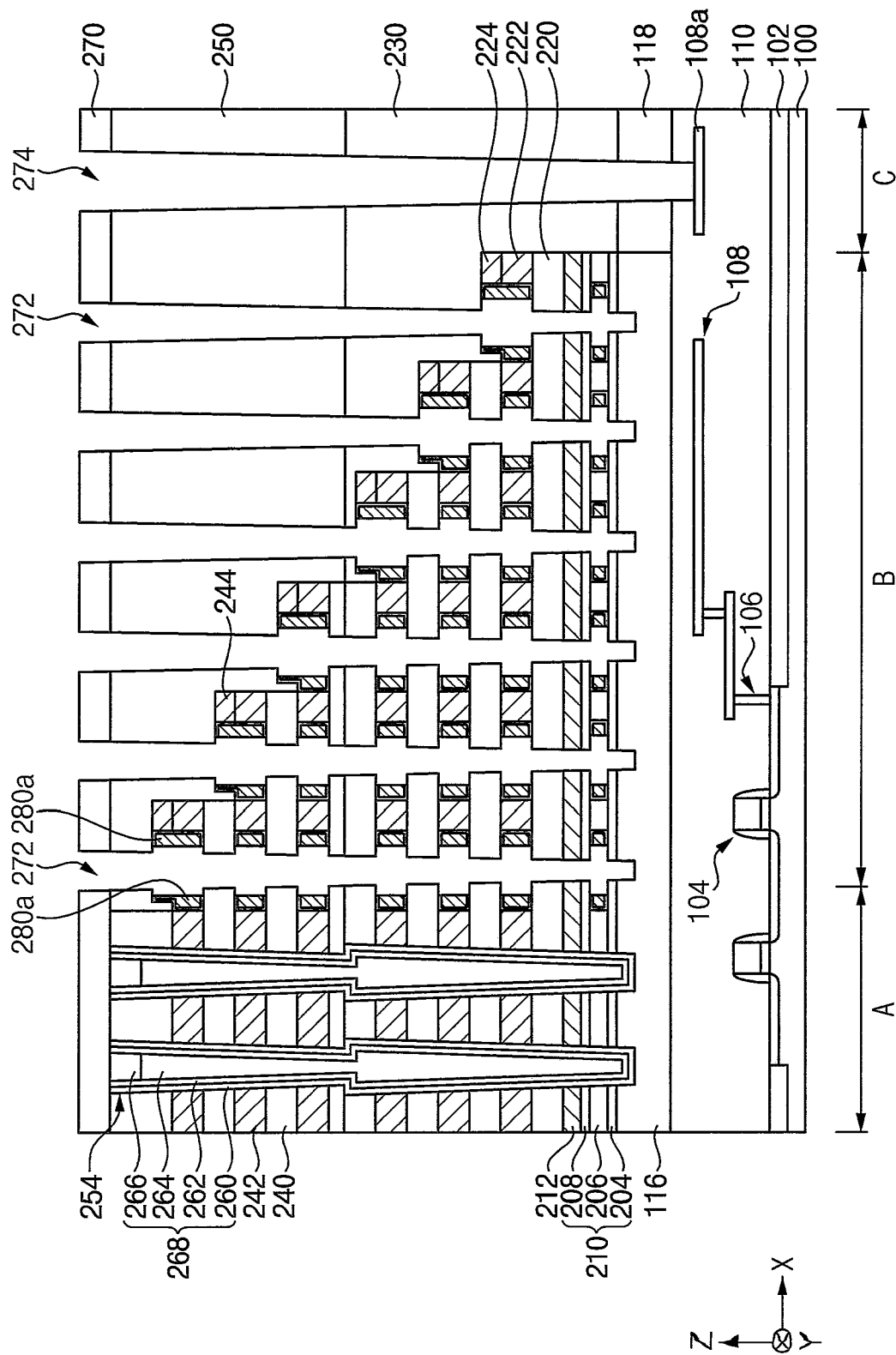
Figure 16:
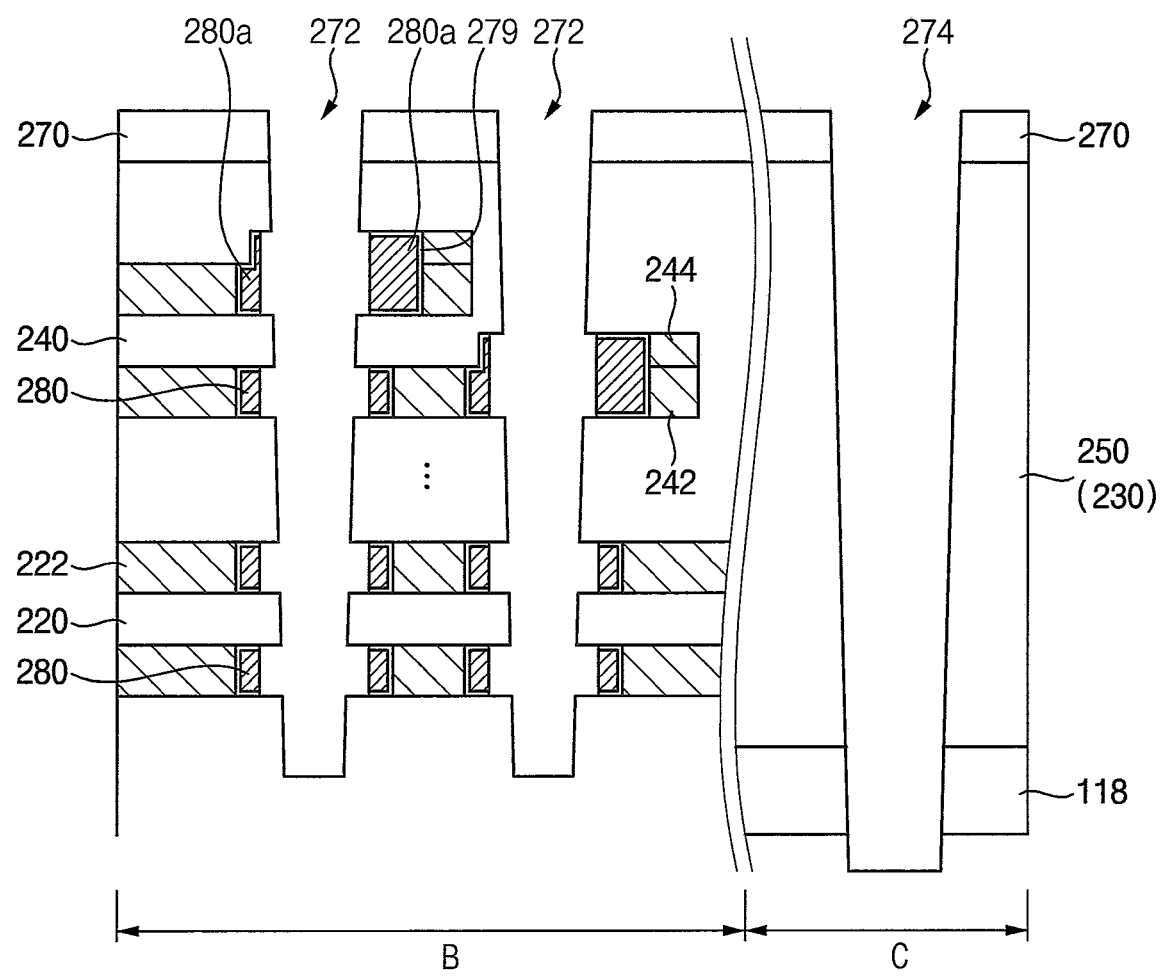

Referring to FIGS. 15 and 16, a first metal layer may be formed to fill the first and second gaps 276a and 276. A portion of the first metal layer may be etched so that the first metal layer may remain only in the first and second gaps 276a and 276 to form first metal patterns 280 and 280a. When the etching process is performed, the first and second insulation layers 220 and 240, the support layer 212, the lower sacrificial layer structure 210, and the base pattern 116 may be exposed by the dummy channel hole 272.

The etching process may include an isotropic etching process, e.g., wet etching process.

In example embodiments, the first metal patterns 280 and 280a may include a metal such as tungsten. In addition, a first barrier metal pattern 279 may be further formed on a surface of the first metal pattern 280 and 280a.

In the process for forming the first metal layer, the first metal layer may also be formed on a sidewall of the through via hole 274. However, during the partial etching process of the first metal layer, the first metal layer formed on the sidewall of the through via hole 274 may be completely removed r.

Figure 17:
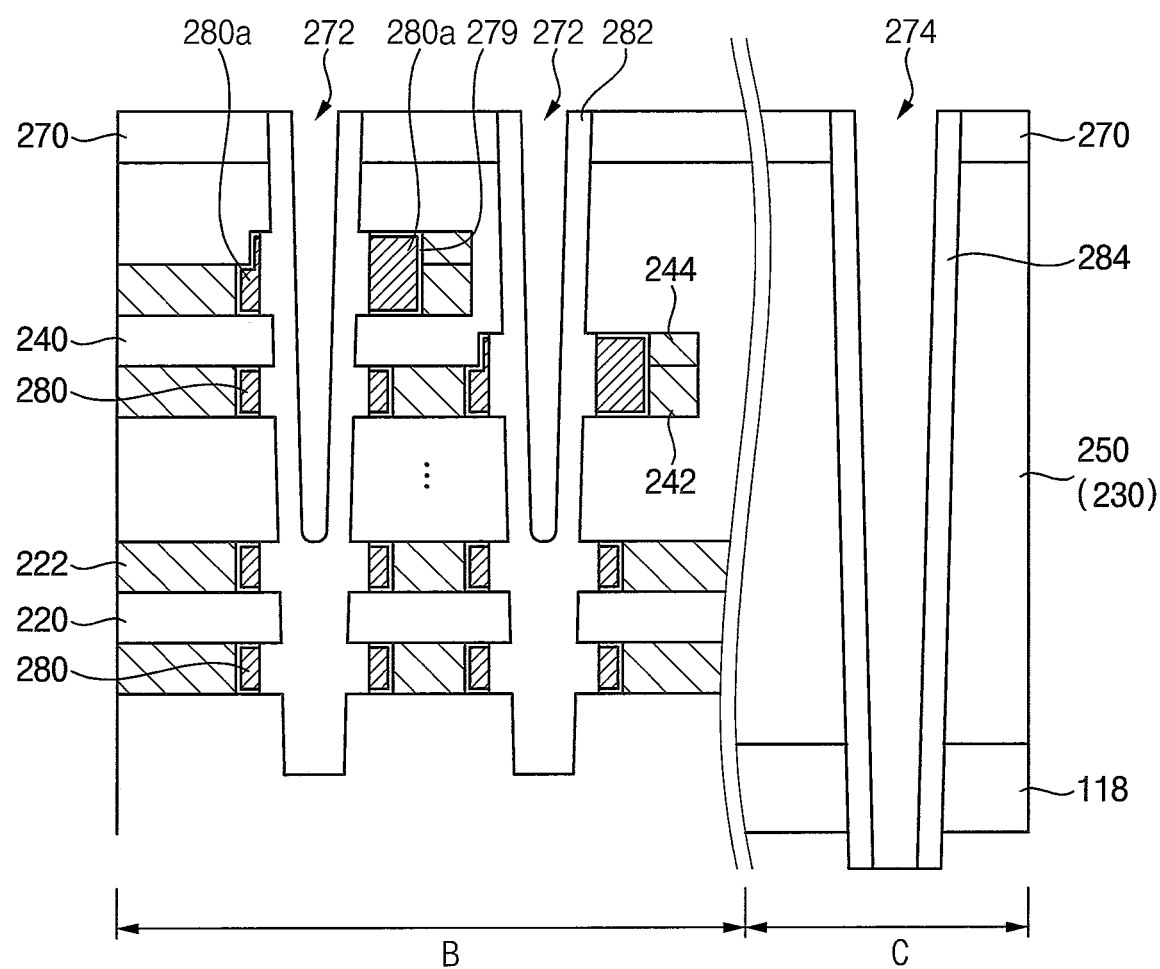

Referring to FIG. 17, a spacer insulation layer may be conformally formed on the third insulating interlayer 270 and inner surfaces of the dummy channel hole 272 and the through via hole 274. For example, the spacer insulation layer may include silicon oxide or silicon nitride.

The upper diameter of the dummy channel hole 272 may be greater than the lower diameter of the dummy channel hole 272, so that the spacer insulation layer may not fill an upper portion of the dummy channel hole 272. However, the lower diameter of the dummy channel hole 272 may be relatively narrow, so that the spacer insulation layer may be folded at a lower sidewall of the dummy channel hole 272. Thus, the spacer insulation layer may fill a lower portion of the dummy channel hole 272. A vertical thickness of the spacer insulation layer from a bottom of the dummy channel hole 272 may be greater than a deposition thickness of the spacer insulation layer.

The through via hole 274 may have the diameter greater than the diameter of the dummy channel hole 272, so that the spacer insulation layer may be conformally formed on a sidewall and a bottom of the through via hole 274. That is, the spacer insulation layer may not fill a lower portion of the through via hole 274. A vertical thickness of the spacer insulation layer from the bottom of the through via hole 274 may be substantially the same as the deposition thickness of the spacer insulation layer.

Thereafter, the spacer insulation layer may be anisotropically etched to form a first spacer layer 282 on the sidewall and bottom of the dummy channel hole 272, and a second spacer 284 on the sidewall of the through via hole 274. When the spacer insulation layer is anisotropically etched, the spacer insulation layer on the bottom of the dummy channel hole 272 may not be completely etched. Therefore, the first spacer layer 282 may sufficiently remain in the bottom of the dummy channel hole 272, so that the bottom of the dummy channel hole 272 may not be exposed. When the spacer insulation layer is anisotropically etched, the spacer insulation layer on the bottom of the through via hole 274 may be completely etched. Therefore, the bottom of the through via hole 274 may be exposed by the second spacer 284. The lower pad pattern may be exposed at the bottom of the through via hole 274.

Figure 18:
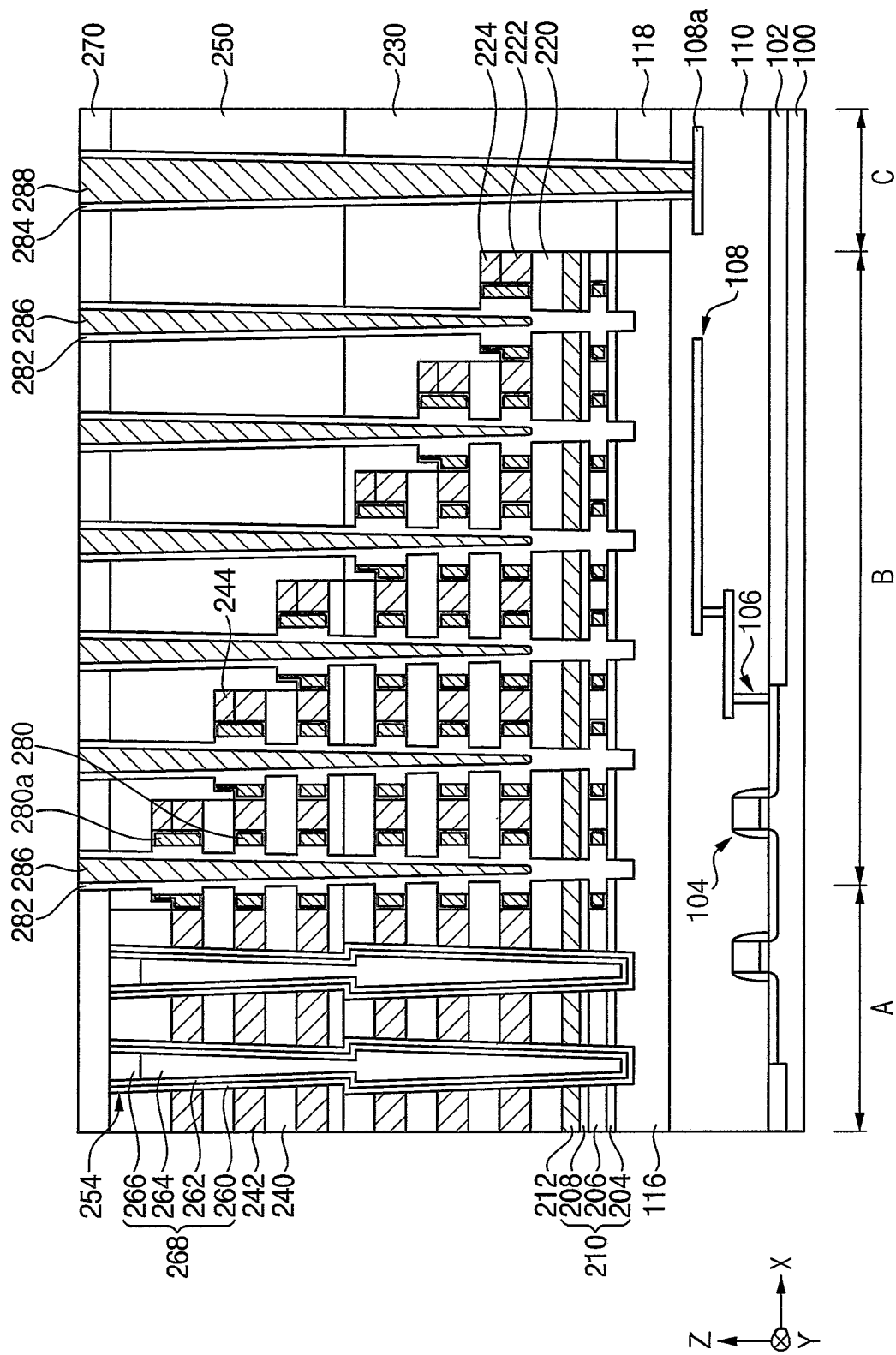
Figure 19:
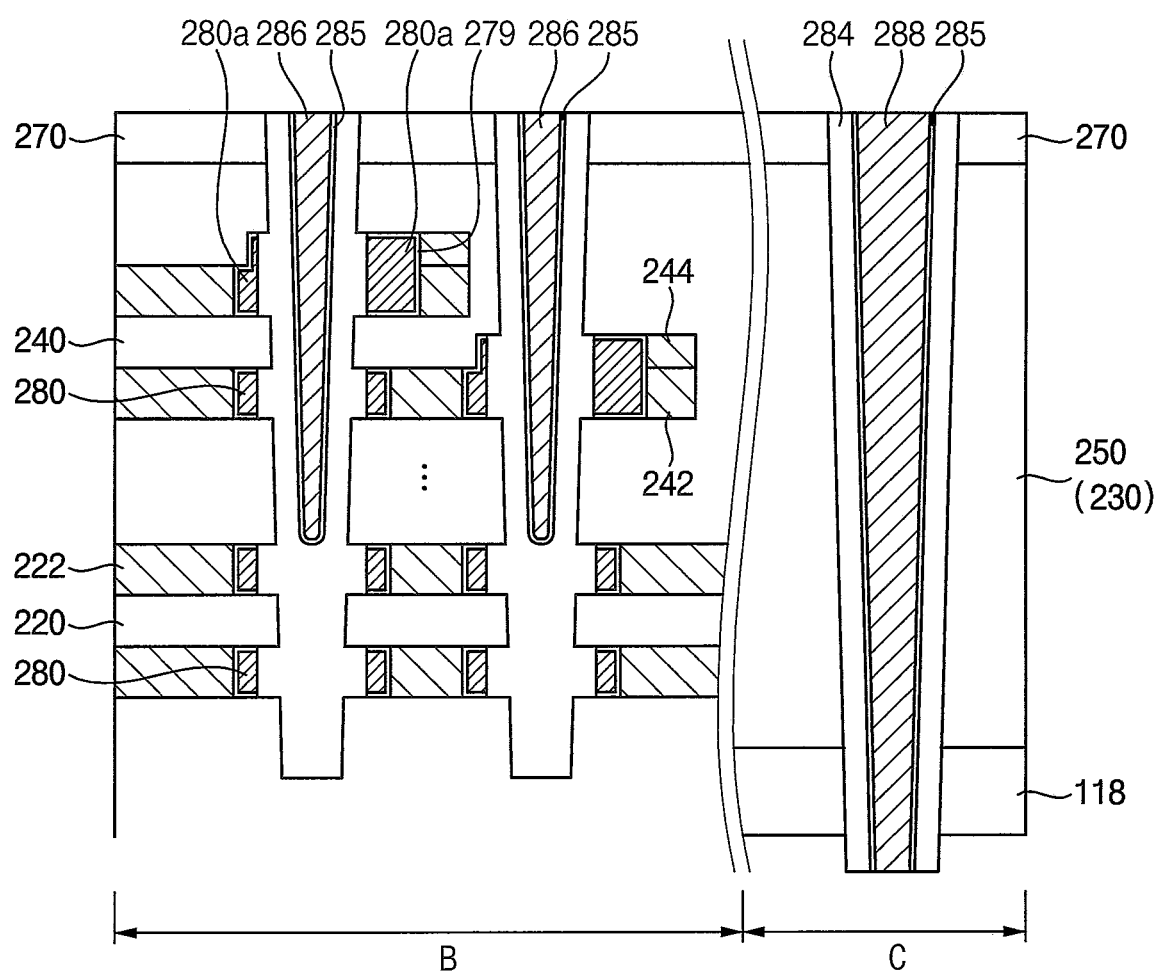

Referring to FIGS. 18 and 19, a metal layer may be formed on the first spacer layer 282, the second spacer 284, and the third insulating interlayer 270 to fill the dummy channel hole 272 and the through via hole 274. Thereafter, a planarization process may be performed until an upper surface of the third insulating interlayer 270 may be exposed to form a second metal pattern 286 and a through via contact 288. The second metal pattern 286 may be formed in the dummy channel hole 272, and the through via contact 288 may be formed in the through via hole 274.

A second barrier metal layer 285 may be further formed on a sidewall and bottom of the second metal pattern 286 and the through via contact 288, as shown in FIG. 19.

The second metal pattern 286 may not contact the bottom of the dummy channel hole 272, and the second metal pattern 286 may be floated from the bottom of the dummy channel hole 272. The second metal pattern 286 may be provided to only fill the dummy channel hole 272, and the second metal pattern 286 may not be electrically connected any circuitry or may not perform any specific electrical functions. Therefore, a process for removing the second metal pattern 286 may not be required.

The through via contact 288 may be electrically connected to the lower pad pattern 108*a*. Thus, the through via contact 288 may be electrically connected to the circuit patterns.

As such, the first spacer layer 282 and the second metal pattern 286 may be formed in the dummy channel hole 272. The first metal patterns 280 and 280*a* may be formed in the first and second gaps 276*a* and 276 and communicate with (i.e., connected with) the dummy channel hole 272. The first metal patterns 280 and 280*a* may contact an outer wall of the first spacer layer 282. The first metal patterns 280 and 280*a*, the first spacer layer 282 and the second metal pattern 286 formed in the dummy channel hole 272 and the first and second gaps 276*a* and 276 may serve as a support structure for supporting a cell stacked structure subsequently formed.

The first metal patterns 280 and 280*a* may surround the outer wall of the first spacer layer 282. In a cross sectional view, the plurality of first metal patterns 280 and 280*a* may protrude laterally from a sidewall of the first spacer layer 282 to have a comb shape. The support structure may include the first metal patterns 280 and 280*a*, so that a structure (i.e., the cell stacked structure) in the second region subsequently formed may be more stably supported by the support structure. The uppermost first metal pattern 280*a* may serve as a portion of a cell pad region forming a cell contact plug. Thus, the cell pad region may be large, and a contact margin of the cell contact plug may be increased. Therefore, the cell contact plug may be easily formed on the cell pad region in a subsequent process.

Figure 20:
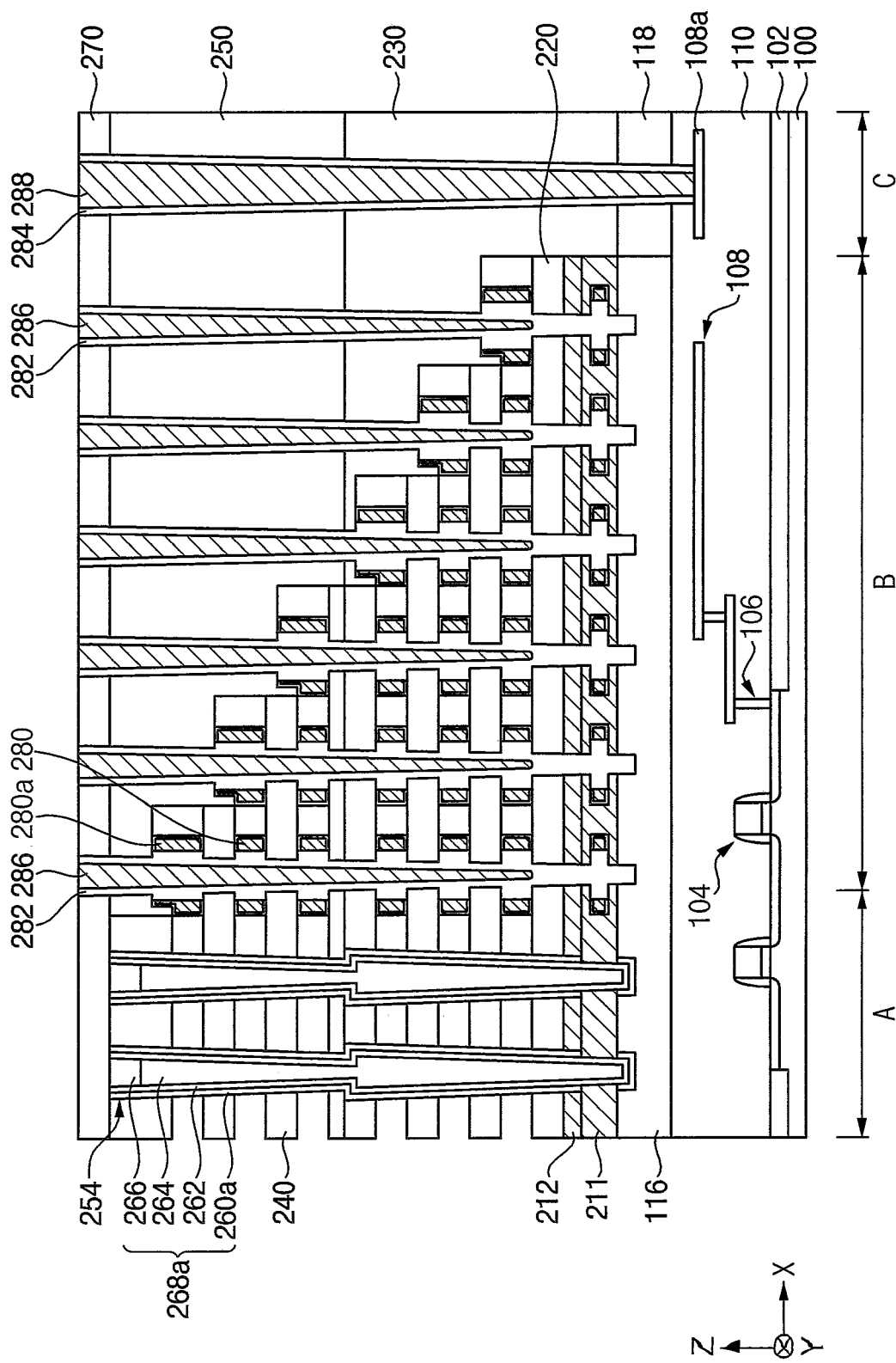
Figure 21:
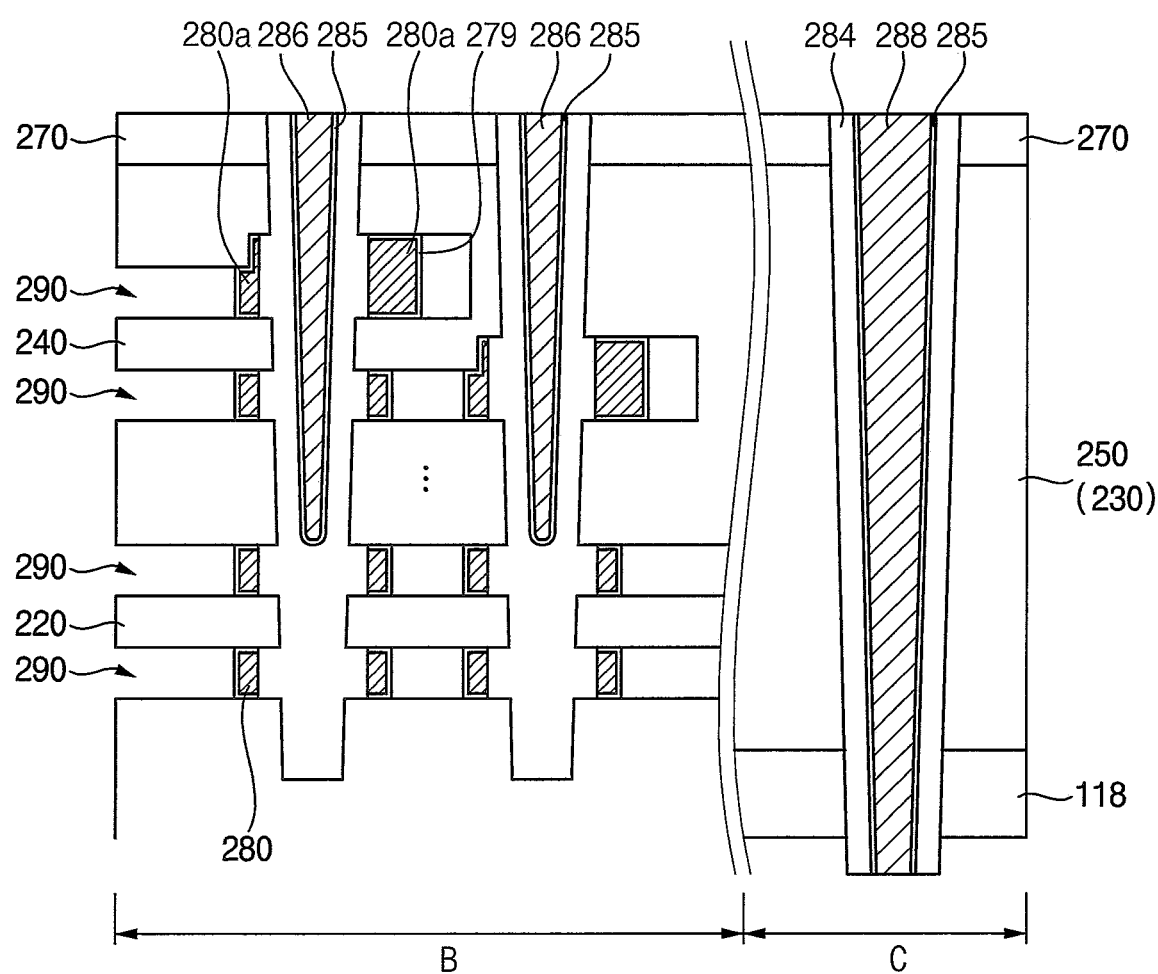

Referring to FIGS. 20 and 21, an etching mask may be formed on the third insulating interlayer 270. The third insulating interlayer 270, the second insulating interlayer 250, the first insulating interlayer 230, the first and second mold structures 226*a* and 246*a*, the support layer 212 and the lower sacrificial layer structure 210 may be etched using the etching mask to form a first opening (not shown) extending in the first direction X. By performing the etching process, a stacked structure including the first and second mold structures 226*a* and 246*a* may be cut to be separated to form a mold structure extending in the first direction X and having a line shape.

The first opening may extend in the first direction X in the first region A and the second region B. The first opening may serve as a word line cut region.

In example embodiments, at least one of second insulation layers 240 and the second sacrificial layers 242 positioned at an upper portion of the second mold structure may be etched to form a trench (not shown) extending in the first direction X. The trench may be an SSL (string selection line) cut region for forming an SSL.

A spacer (not shown) may be formed on the sidewall of the first opening positioned higher than the support layer 212. The lower sacrificial layer structure 210 may be selectively removed to form a third gap (not shown). The preliminary charge storage structure 260 exposed by the third gap may be etched to form a charge storage structure 260*a*. A lower portion of the channel 262 may be exposed by the etching process. Thus, a channel structure 268*a* may be formed in the channel hole 254.

A channel connection pattern 211 may be formed to fill the third gap. The channels 262 formed in the channel holes 254 may be electrically connected to each other by the channel connection pattern 211. The channel connection pattern 211 may include polysilicon. In example embodiments, the first metal pattern 280 may also be formed in the channel connection pattern 211.

The spacer may be removed, so that a sidewall of the mold structure may be exposed by the first opening. The first and second sacrificial layers 222 and 242 and the first and second sacrificial patterns 224 and 244 included in the mold structure may be removed to form fourth gaps 290 between the first insulation layers 220 and between the second insulation layers 240. The outer walls of the first metal patterns 280 and 280*a* may be exposed by the fourth gaps 290 in the second region.

The removing process may include a wet etching process.

When the first and second sacrificial layers 222 and 242 and the first and second sacrificial patterns 224 and 244 are removed, the mold structure including the fourth gaps 290 may not lean and may be supported by the channel structures 268*a* in the first region A. Further, when the first and second sacrificial layers 222 and 242 and the first and second sacrificial patterns 224 and 244 are removed, the mold structure including the fourth gaps 290 and having a step shape may not lean and may be supported by the support structure in the second region B. Particularly, the first metal patterns 280 and 280*a* may be included in the support structure, so that the mold structure having the step shape may be supported more stably.

Figure 22:
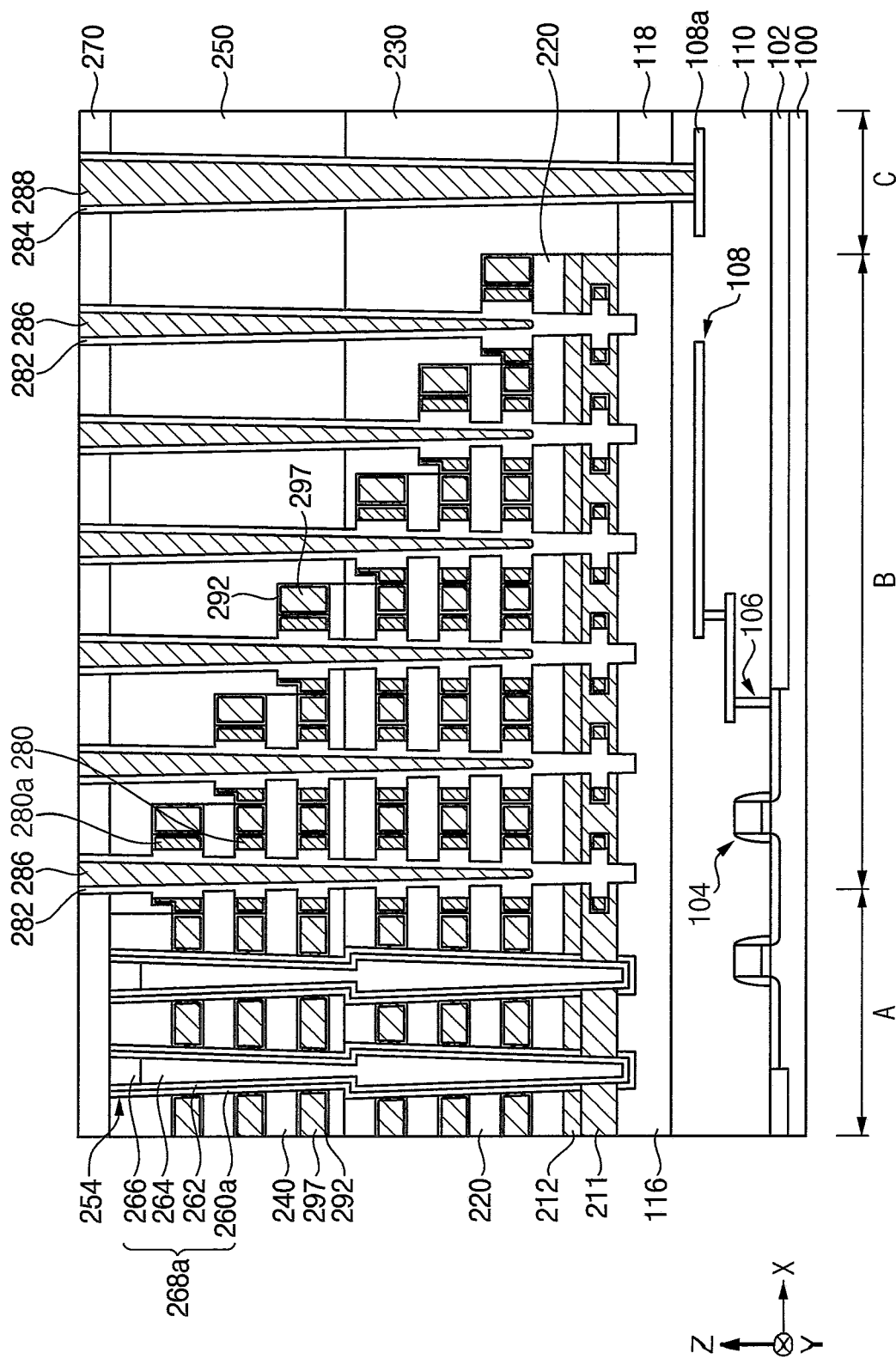
Figure 23:
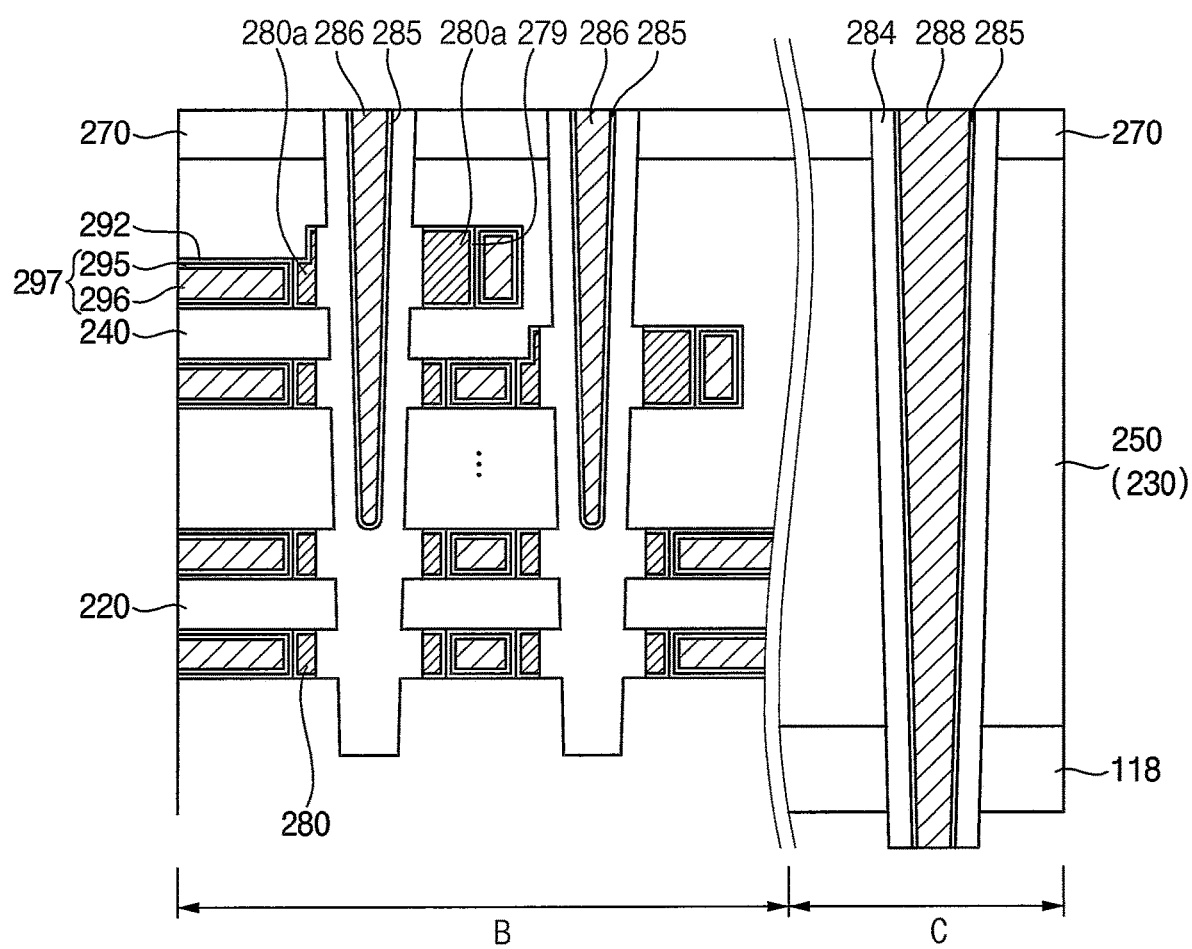

Referring to FIGS. 22 and 23, a second blocking layer may be conformally formed on surfaces of the fourth gaps 290. The second blocking layer may be formed to prevent back tunneling in memory cells subsequently formed. The second blocking layer may include a metal oxide, e.g., aluminum oxide.

The second blocking layer formed in the second region B may contact outer walls of the first metal patterns 280 and 280*a*.

A third barrier metal layer may be conformally formed on a surface of the second blocking layer. A gate conductive layer may be formed on the third barrier metal layer to fill the fourth gaps 290. The gate conductive layer may include a metal, e.g., tungsten, copper, or aluminum.

Portions of the second blocking layer, the third barrier metal layer, and the gate conductive layer may be removed so that the second blocking layer, the third barrier metal layer, and the gate conductive layer remain only in the fourth gaps 290. That is, the second blocking layer, the third barrier metal layer, and the gate conductive layer formed in the first opening may be removed.

Thus, a second blocking layer pattern 292 and a gate pattern 297 may be formed in the fourth gaps 290. The gate pattern 297 may include a third barrier metal pattern 295 and a gate conductive pattern 296. The second blocking layer pattern 292 may surround a surface of the gate pattern 297.

In the second region B, the second blocking layer pattern 292 may be interposed between the sidewalls of the first metal patterns 280 and 280*a* included in the support structure and sidewalls of the gate pattern 297 adjacent thereto. In example embodiments, the second blocking layer pattern 292 may directly contact the third barrier metal pattern 295 of the gate pattern 297 and the first barrier metal pattern 279 surrounding the first metal patterns 280 and 280*a*.

In the second region B, the second blocking layer pattern 292 and the gate pattern 297 may be disposed on the sidewall of the first metal patterns 280 and 280*a* included in the support structure in a lateral direction. The second blocking layer pattern 292 may be disposed between the first metal patterns 280 and 280*a* and the gate pattern 297, so that the first metal pattern 280 and the gate pattern 297 may be clearly distinguished by the second blocking layer pattern 292.

The gate pattern 297 may extend in the first direction X. In the second region B, an upper surface of the step portion may serve as the cell pad region for forming the cell contact plug 300. In example embodiments, the uppermost first metal pattern 280a, the second blocking layer pattern 292, and the gate pattern 297 may be disposed in the cell pad region.

Figure 24:
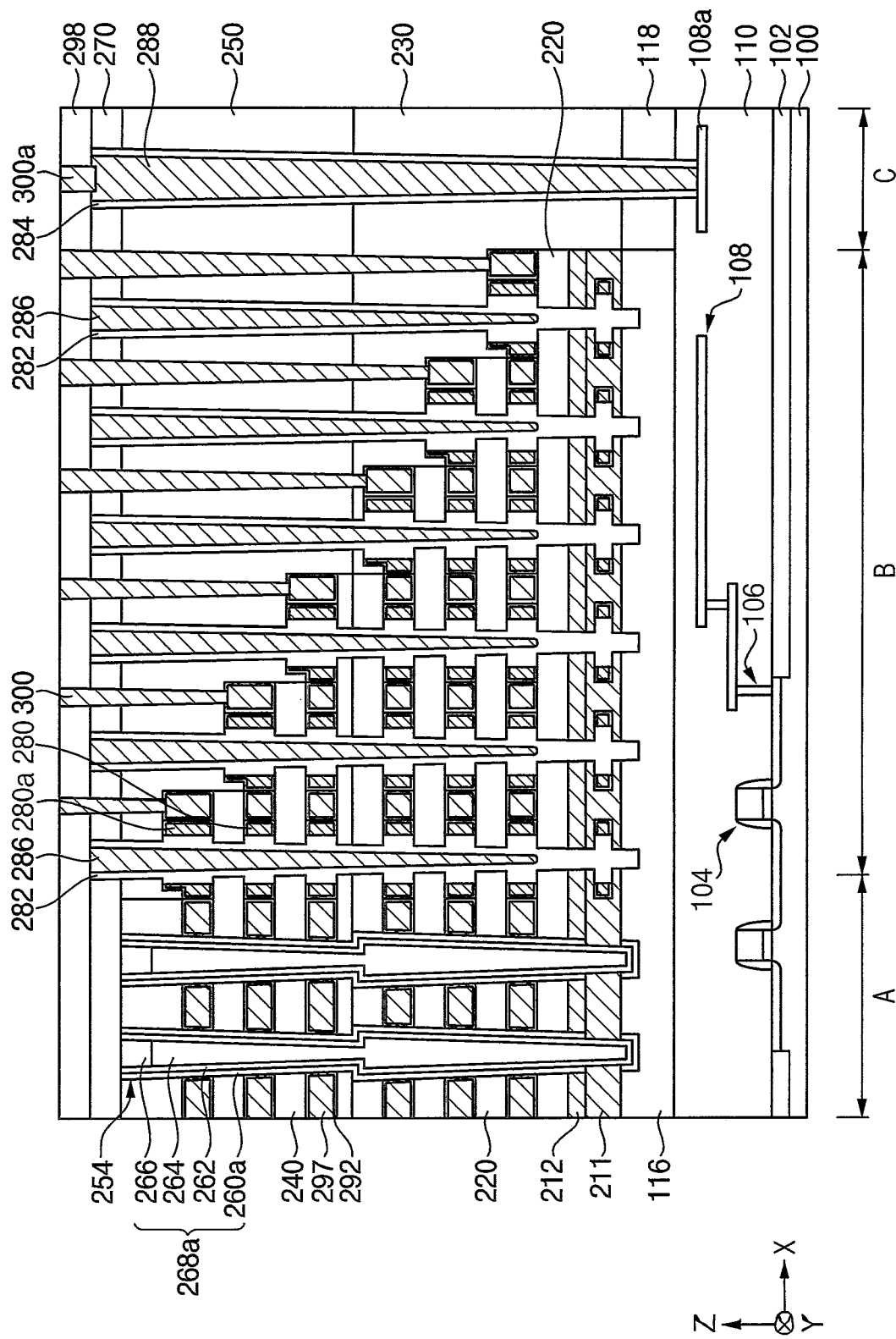

Referring to FIG. 24, a fourth insulating interlayer 298 may be formed on the third insulating interlayer 270, the channel structure 268a, the support structure, the second spacer 284, and the through via contact 288.

The fourth insulating interlayer 298, the third insulating interlayer 270, the second insulating interlayer 250, and the first insulating interlayer 230 in the second region B may be etched to form cell contact holes exposing at least the gate pattern 297 in the cell pad region. In example embodiments, the gate pattern 297 may be exposed by a bottom of each of the cell contact holes.

In some example embodiments, the gate pattern 297, the second blocking layer pattern 292 and the uppermost first metal pattern 280a may be exposed together by a bottom of each of the cell contact holes.

The fourth insulating interlayer 298 in the third region C may be etched to form a first contact hole exposing an upper surface of the through via contact 288.

A conductive layer may be formed on the fourth insulating interlayer 298 to fill the cell contact holes and the first contact hole. The conductive layer may be planarized until an upper surface of the fourth insulating interlayer 298 may be exposed to form a cell contact plug 300 filling the cell contact holes and a first contact plug 300a filling the first contact hole. In some example embodiments, before forming the conductive layer, a barrier metal layer may be further formed on the fourth insulating interlayer 298, the cell contact holes and the first contact hole.

The cell contact plug 300 may contact at least the gate pattern 297. In some example embodiments, as shown in FIGS. 3A and 3B, the cell contact plug 300 may contact the gate pattern 297, the second blocking layer pattern 292 and the uppermost first metal pattern 280a.

As such, a portion of the cell contact plug may contact the first metal pattern 280a, so that the contact margin of the cell contact plug may be increased.

Figure 25:
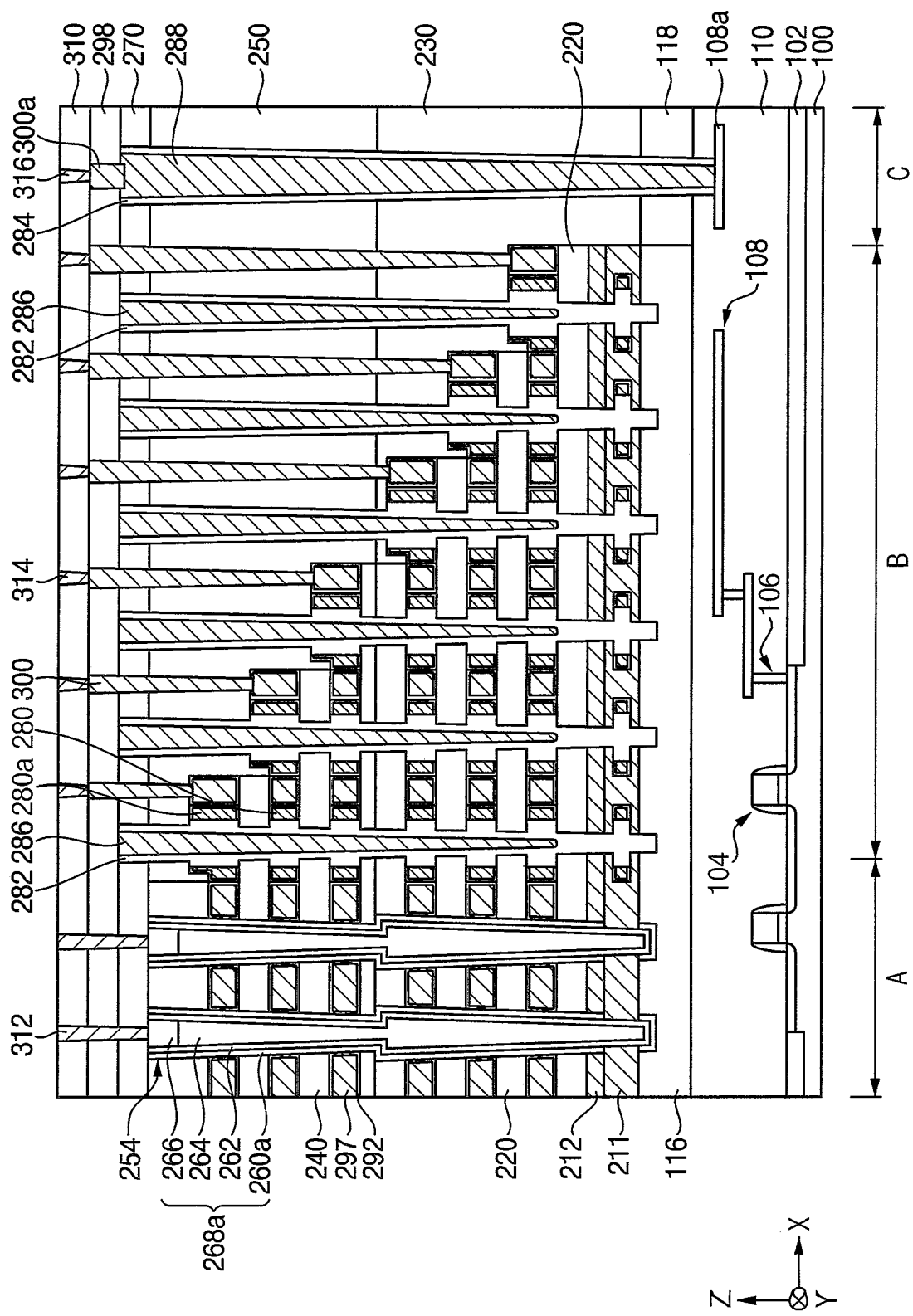

Referring to FIG. 25, a fifth insulating interlayer 310 may be formed on the fourth insulating interlayer 298, the cell contact plug 300, and the first contact plug 300a.

A second contact plug 312 may be formed through the fifth insulating interlayer 310, the fourth insulating interlayer 298, and the third insulating interlayer 270 in the first region A. The second contact plug 312 may contact the capping pattern 266 of the channel structure 268a. A third contact plug 314 contacting cell contact plugs 300 may be formed through the fifth insulating interlayer 310 in the second region B. A fourth contact plug 316 contacting the first contact plug 300a may be formed through the fifth insulating interlayer 310 in the third region C.

In some example embodiments, an upper insulating interlayer may be further formed on the fifth insulating interlayer 310. Upper wirings may be further formed through the upper insulating interlayer. The upper wirings may be electrically connected to each of the second to fourth contact plugs. As described above, the vertical memory device may thus be manufactured.

Figure 26:
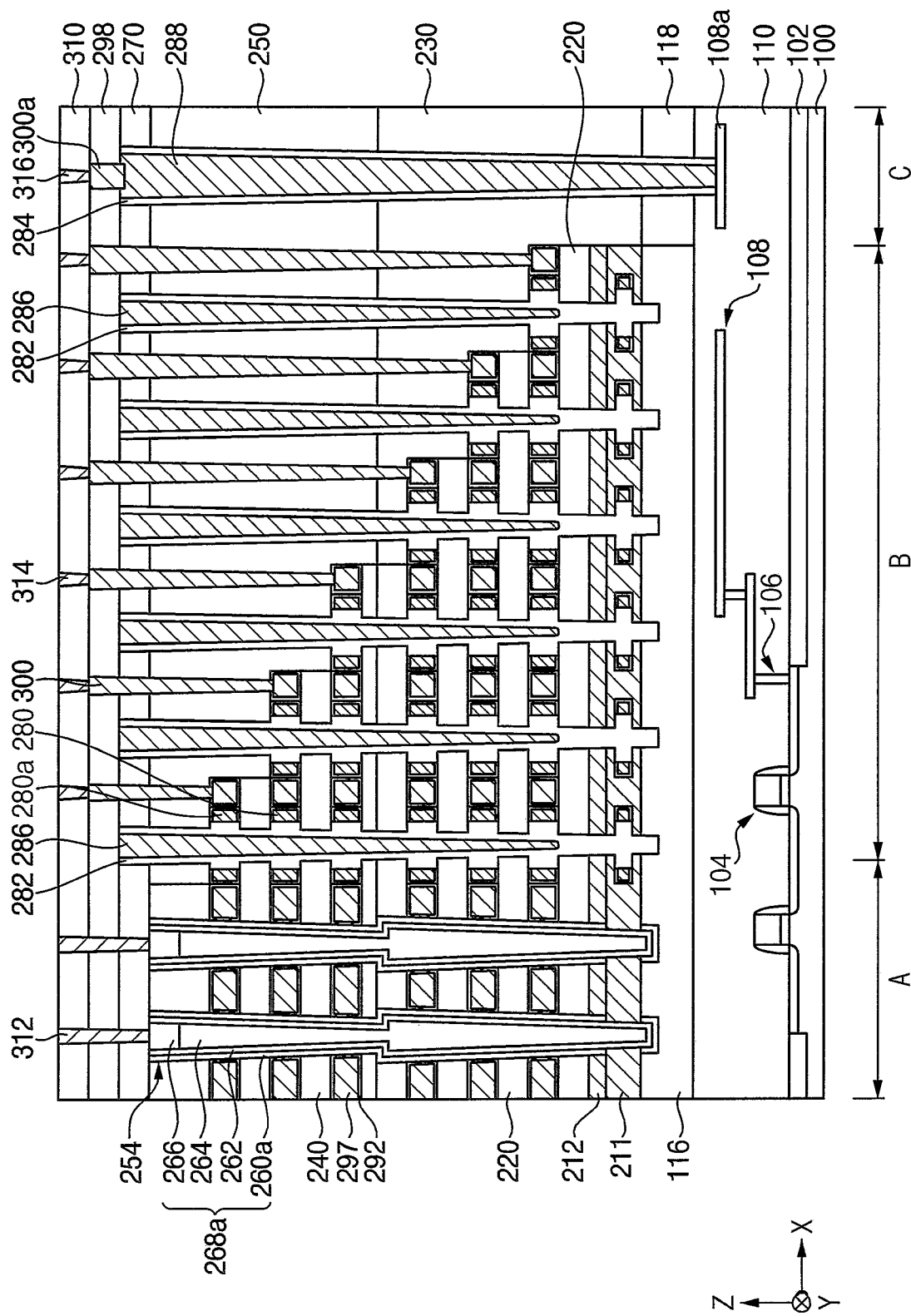
FIG. 26 illustrates a cross-sectional view of a vertical memory device in accordance with embodiments of the inventive concepts.
Figure 27:
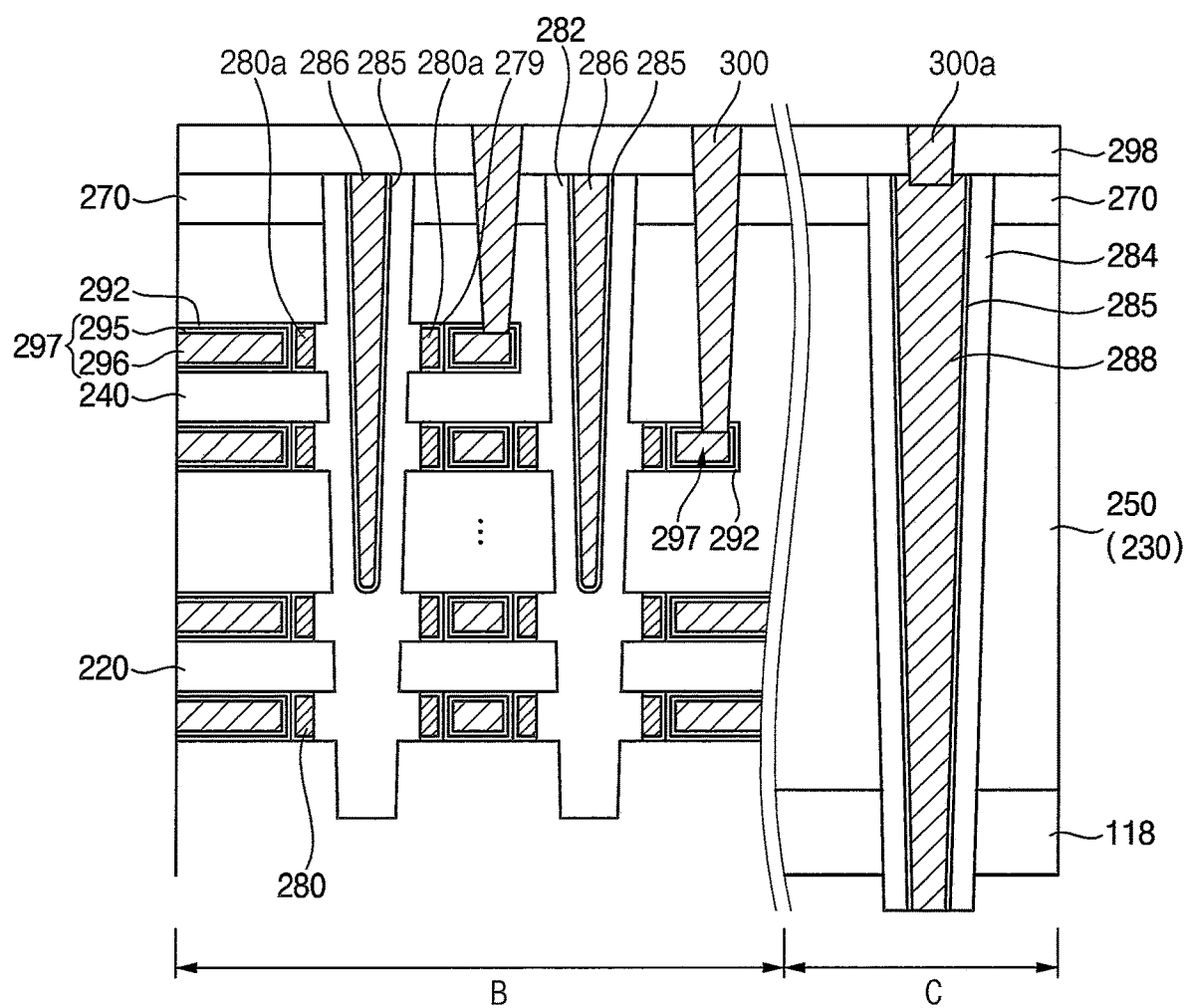
FIG. 27 illustrates an enlarged cross-sectional view of a step portion and a through via hole portion of a vertical memory device in accordance with embodiments of the inventive concepts.

FIG. 26 illustrates a cross-sectional view of a vertical memory device in accordance with embodiments of the inventive concepts. FIG. 27 illustrates an enlarged cross-sectional view of a step portion and a through via hole portion of the vertical memory device of FIG. 26.

The vertical memory device in FIG. 26 may be substantially the same as or similar to the vertical memory device illustrated with reference to FIGS. 1, 2A, 2B, 3A, and 3B, except for shapes of the support structure and the gate pattern in the cell pad region.

Referring to FIGS. 26 and 27, a vertical thickness of the step portion of the gate pattern 297 positioned at an edge in the first direction X may be substantially the same as a vertical thickness of the extension portion of the gate pattern 297 connected thereto. That is, an upper surface and a lower surface of the gate pattern 297 may be substantially flat, and the gate pattern 297 may extend in the first direction X.

A vertical thickness of the first metal pattern 280a in the step portion (i.e., an uppermost first metal pattern) may be substantially the same as a vertical thickness of the first metal pattern 280 in the extension portion below the step portion. Further, a width of the first metal pattern 280a in the step portion may be substantially the same as a width of the first metal pattern 280 in the extension portion below the step portion.

The vertical memory device as shown in FIG. 26 may be manufactured by processes substantially the same as or similar to that illustrated with reference to FIGS. 6 to 25. However, when the process described with reference to FIG. 8 is performed, the first sacrificial pattern 224 is not formed on the step portions of the first preliminary mold structure 226. Further, when the process illustrated with reference to FIG. 10 is performed, the second sacrificial pattern 244 is not formed on the step portions of the second preliminary mold structure.

Figure 28:
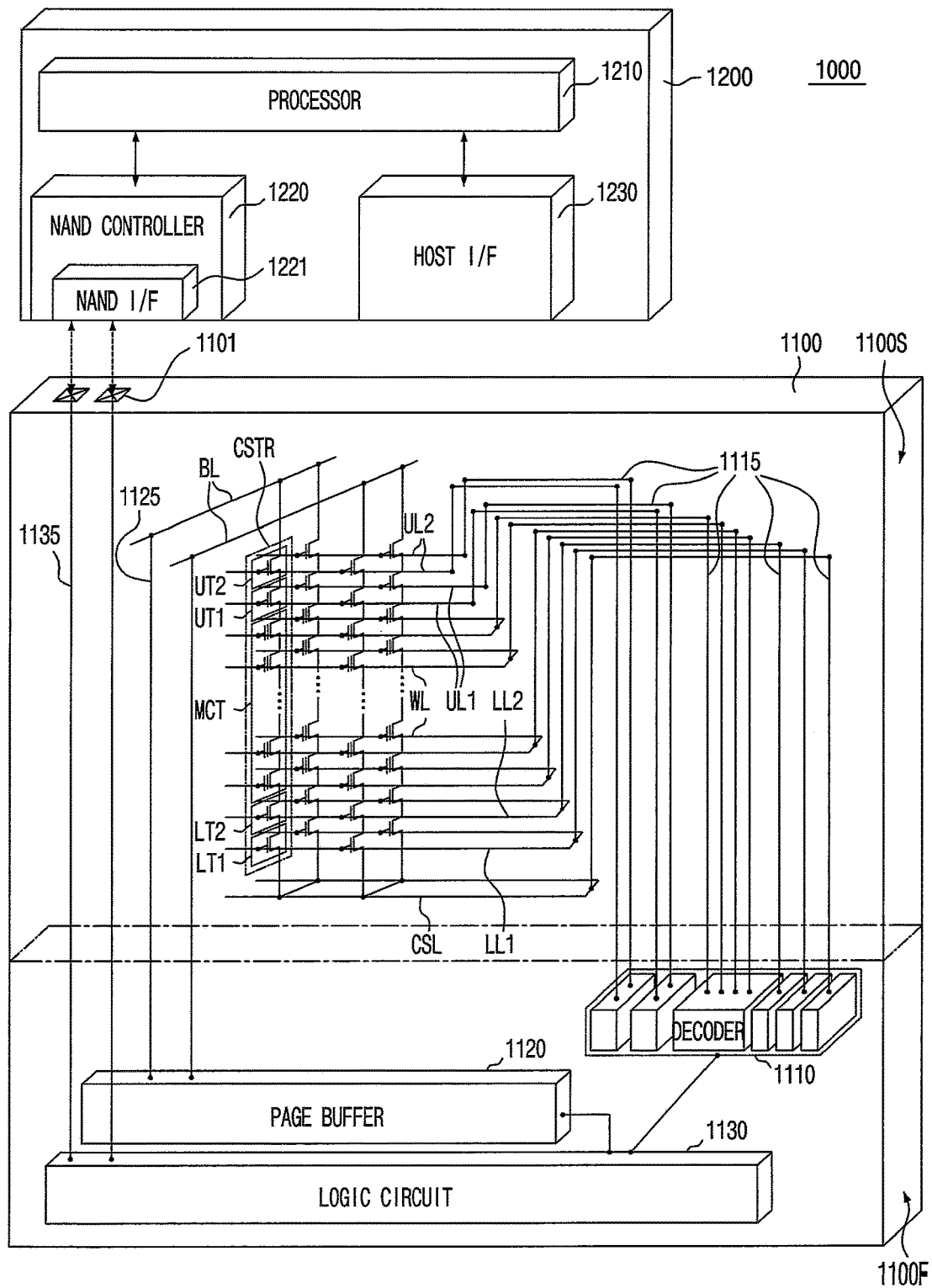
FIG. 28 illustrates a schematic diagram of an electronic system including a semiconductor device in accordance with embodiments of the inventive concepts.

FIG. 28 illustrates a schematic diagram of an electronic system including a semiconductor device in accordance with embodiments of the inventive concepts.

Referring to FIG. 28, an electronic system 1000 in accordance with example embodiments may include a semiconductor device 1100 and a controller 1200 electrically connected to the semiconductor device 1100. The electronic system 1000 may be a storage device including one or more semiconductor devices 1100 or an electronic device including the storage device. For example, the electronic system 1000 may be a solid state drive device (SSD), a universal serial bus (USB), a computing system, a medical device, or a communication device, which include one or more semiconductor devices 1100.

The semiconductor device 1100 may be a non-volatile memory device. For example, the semiconductor device 1100 may be a NAND flash memory device having the COP structure such as illustrated with reference to FIG. 1, 4A, 4B, 5 or 26.

The semiconductor device 1100 may include a first structure 1100F and a second structure 1100S on the first structure 1100F. In example embodiments, the first structure 1100F may be beside of the second structure 1100S. The first structure 1100F may be a peripheral circuit structure including a decoder circuit 1110, a page buffer 1120, and a logic circuit 1130. The second structure 1100S may include a bit line BL, a common source line CSL, a word lines WL, first and second gate upper lines UL1 and UL2, and first and second gate lower lines LL1 and LL2, and memory cell strings CSTR between the bit line BL and the common source line CSL. The second structure 1100S may serve as a memory cell structure.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT between the lower transistors LT1 and LT2 and the upper transistors UT1 and UT2. The number of lower transistors LT1 and LT2 and the number of upper transistors UT1 and UT2 may be variously modified in accordance with embodiments.

In example embodiments, the upper transistors UT1 and UT2 may include a string selection transistor, and the lower transistors LT1 and LT2 may include a ground selection transistor. Gate lower lines LL1 and LL2 may be gate electrodes of lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

In example embodiments, the lower transistors LT1 and LT2 may include a lower erase control transistor LT1 and a ground selection transistor LT2 connected in series. The upper transistors UT1 and UT2 may include a string select transistor UT1 and an upper erase control transistor UT2 connected in series. At least one of the lower erase control transistor LT1 and the upper erase control transistor UT1 may be used to erase data stored in the memory cell transistors MCT, and the data may be erased by using a gate induced leakage current (GIDL).

The common source line CSL, the first and second gate lower lines LL1 and LL2, the word lines WL, and the first and second gate upper lines UL1 and UL2 may be electrically connected to the decoder circuit 1110 by a first connection wiring 1115 extending to the second structure 1100S from the first structure 110F. The bit lines BL may be electrically connected to the page buffer 1120 by a second connection wiring 1125 extending from the first structure 110F to the second structure 1100S.

In the first structure 110F, the decoder circuit 1110 and the page buffer 1120 may control at least one selected memory cell transistor among the plurality of memory cell transistors MCT. The decoder circuit 1110 and the page buffer 1120 may be controlled by the logic circuit 1130. The semiconductor device 1100 may communicate with the controller 1200 by an input/output pad 1101 electrically connected to the logic circuit 1130. The input/output pad 1101 may be electrically connected to the logic circuit 1130 by an input/output connection wiring 1135 extending from the first structure 110F to the second structure 1100S.

The controller 1200 may include a processor 1210, a NAND controller 1220, and a host interface 1230. In example embodiments, the electronic system 1000 may include a plurality of semiconductor devices 1100. In this case, the controller 1200 may control the plurality of semiconductor devices 1100.

The processor 1210 may control an overall operation of the electronic system 1000 including the controller 1200. The processor 1210 may operate according to firmware. The processor 1210 may control the NAND controller 1220 so that the semiconductor device 1100 may be accessed. The NAND controller 1220 may include a NAND interface (I/F) 1221 for communication with the semiconductor device 1100. A control command for controlling the semiconductor device 1100, data for writing in the memory cell transistors MCT of the semiconductor device 1100, and data for reading from the memory cell transistors MCT of the semiconductor device 1100 may be transmitted by the NAND interface 1221. Communication between the electronic system 1000 and an external host may be through the host interface (I/F) 1230. When the control command is received from the external host by the host interface 1230, the processor 1210 may control the semiconductor device 1100 in response to the control command.

Figure 29:
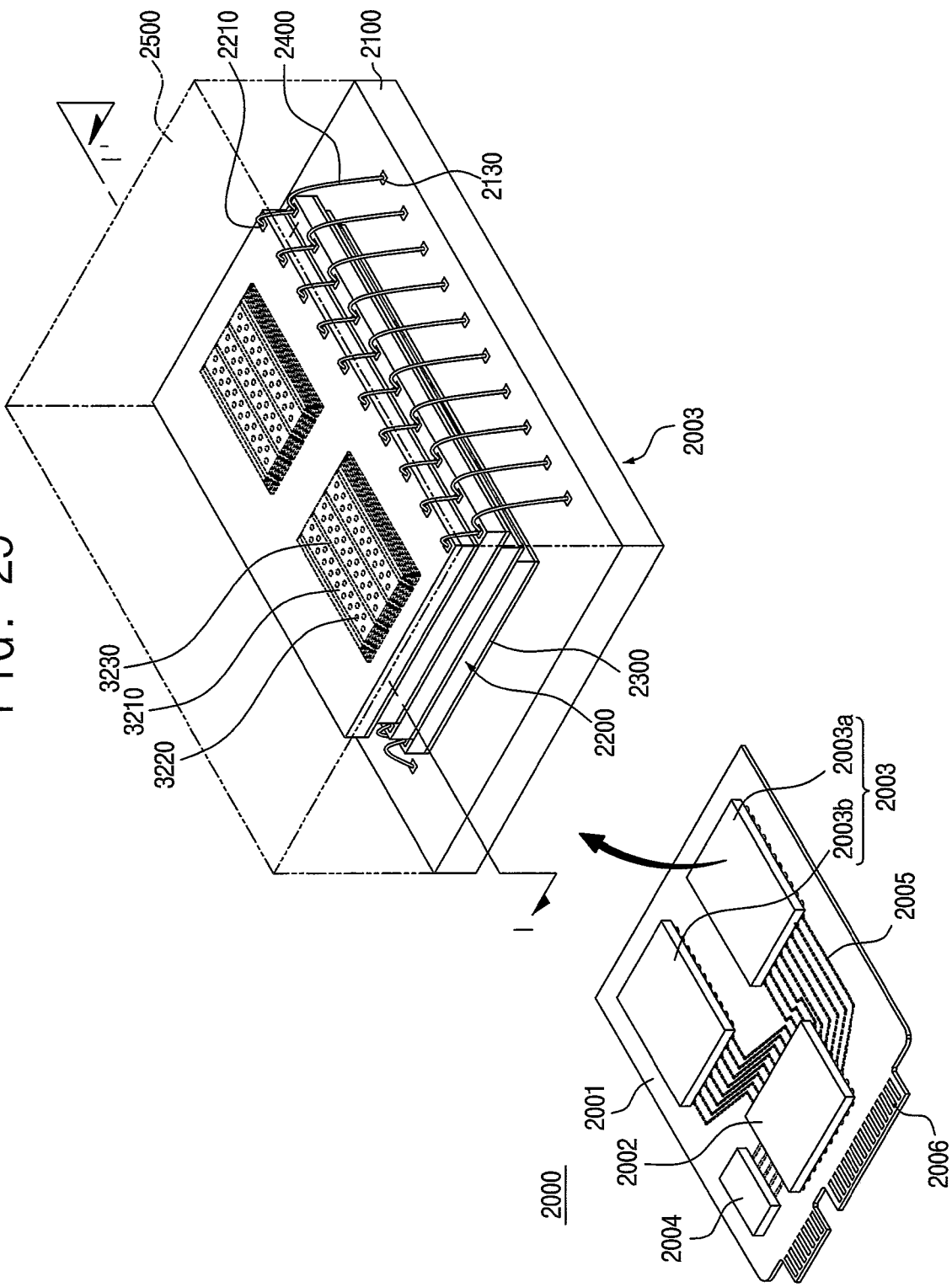
FIG. 29 illustrates a schematic perspective view of an electronic system including a semiconductor device in accordance with embodiments of the inventive concepts.

FIG. 29 illustrates a schematic perspective view of an electronic system including a semiconductor device in accordance with embodiments of the inventive concepts.

Referring to FIG. 29, an electronic system 2000 in accordance with example embodiments may include a main substrate 2001, a controller 2002 mounted on the main substrate 2001, one or more semiconductor packages 2003, and a DRAM 2004. The semiconductor package 2003 and the DRAM 2004 may be connected to the controller 2002 by wiring patterns 2005 formed on the main substrate 2001.

The main substrate 2001 may include a connector 2006 including a plurality of pins coupled to an external host. The number and arrangement of the plurality of pins in the connector 2006 may be disposed according to a communication interface between the electronic system 2000 and the external host. In example embodiments, the electronic system 2000 may for example communicate with the external host by one of interfaces including a Universal Serial Bus (USB), a Peripheral Component Interconnect Express (PCI-Express), a Serial Advanced Technology Attachment (SATA), an M-Phy for Universal Flash Storage (UFS), etc. In example embodiments, the electronic system 2000 may be operated by power supplied from the external host through the connector 2006. The electronic system 2000 may further include a Power Management Integrated Circuit (PMIC) (not shown) for distributing the power supplied from the external host to the controller 2002 and the semiconductor package 2003.

The controller 2002 may write data in the semiconductor package 2003, or the controller 2002 may read data from the semiconductor package 2003. An operation speed of the electronic system 2000 may be improved by the controller 2002.

The DRAM 2004 may be a buffer memory for reducing a difference between a speed of the semiconductor package 2003 for storing data and a speed of the external host. The DRAM 2004 included in the electronic system 2000 may also operate as a type of a cache memory, and the DRAM 2004 may provide a space for temporarily storing data in a control operation of the semiconductor package 2003. When the DRAM 2004 is included in the electronic system 2000, the controller 2002 may include a DRAM controller for controlling the DRAM 2004 and a NAND controller for controlling the semiconductor package 2003.

The semiconductor package 2003 may include first and second semiconductor packages 2003a and 2003b spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, the semiconductor chips 2200 on the package substrate 2100, adhesion layers 2300 disposed on a lower surface of each of the semiconductor chips 2200, a connection structure 2400 electrically connected to the semiconductor chips 2200 and the package substrate 2100, and a molding layer 2500 covering the semiconductor chips 2200 and the connection structure 2400 on the package substrate 2100.

The package substrate 2100 may be a printed circuit board including package upper pads 2130. Each of the semiconductor chips 2200 may include an input/output pad 2210. The input/output pad 2210 may correspond to the input/output pad 1101 of FIG. 28. Each of the semiconductor chips 2200 may include cell stacked structures 3210, channel structures 3220 and cut regions 3230. Each of the semiconductor chips 2200 may include, e.g., the vertical memory device having the COP structure illustrated with reference to FIG. 1, 4A, 4B, 5 or 26.

In example embodiments, the connection structure 2400 may be a bonding wire for electrically connecting with the input/output pad 2210 and the package upper pads 2130. Thus, in each of the first and second semiconductor packages 2003a and 2003b, the semiconductor chips 2200 may be electrically connected to each other by the bonding wire. The semiconductor chips 2200 may be electrically connected to the package upper pads 2130 on the package substrate 2100. In some example embodiments, in each of the first and second semiconductor packages 2003a and 2003b, the semiconductor chips 2200 may be electrically connected to each other by the connection structures including through silicon vias (TSV) instead of the bonding wiring.

In example embodiments, the controller 2002 and the semiconductor chips 2200 may be included in one package. In some example embodiments, the controller 2002 and the semiconductor chips 2200 may be mounted on a separate interposer substrate different from the main substrate 2001, and the controller 2002 and the semiconductor chips 2220 may be connected to each other by wirings formed on the interposer substrate.

Figure 30:
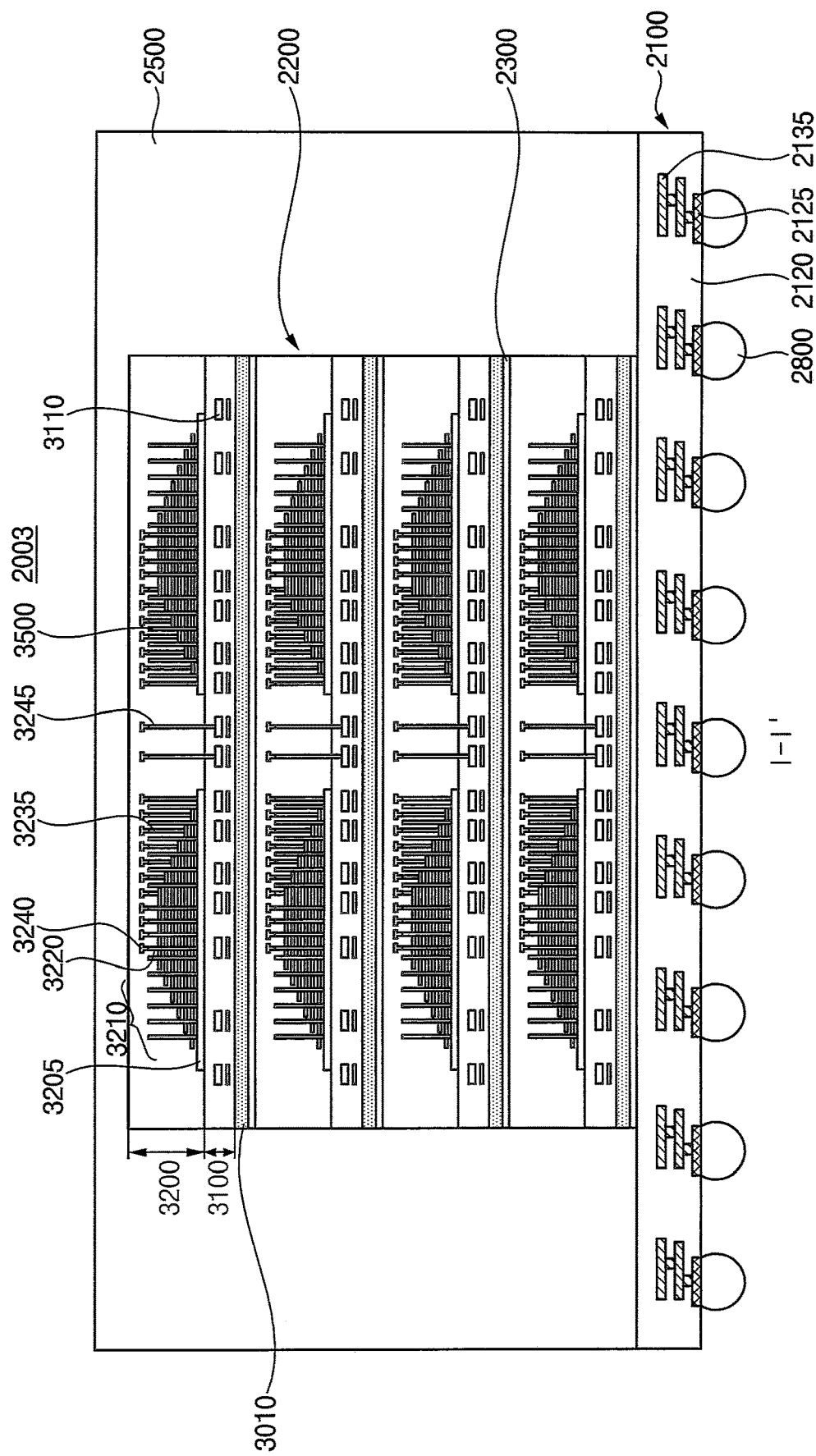
FIG. 30 illustrates a cross-sectional schematic view of semiconductor package in accordance with embodiments of the inventive concepts.
Figure 31:
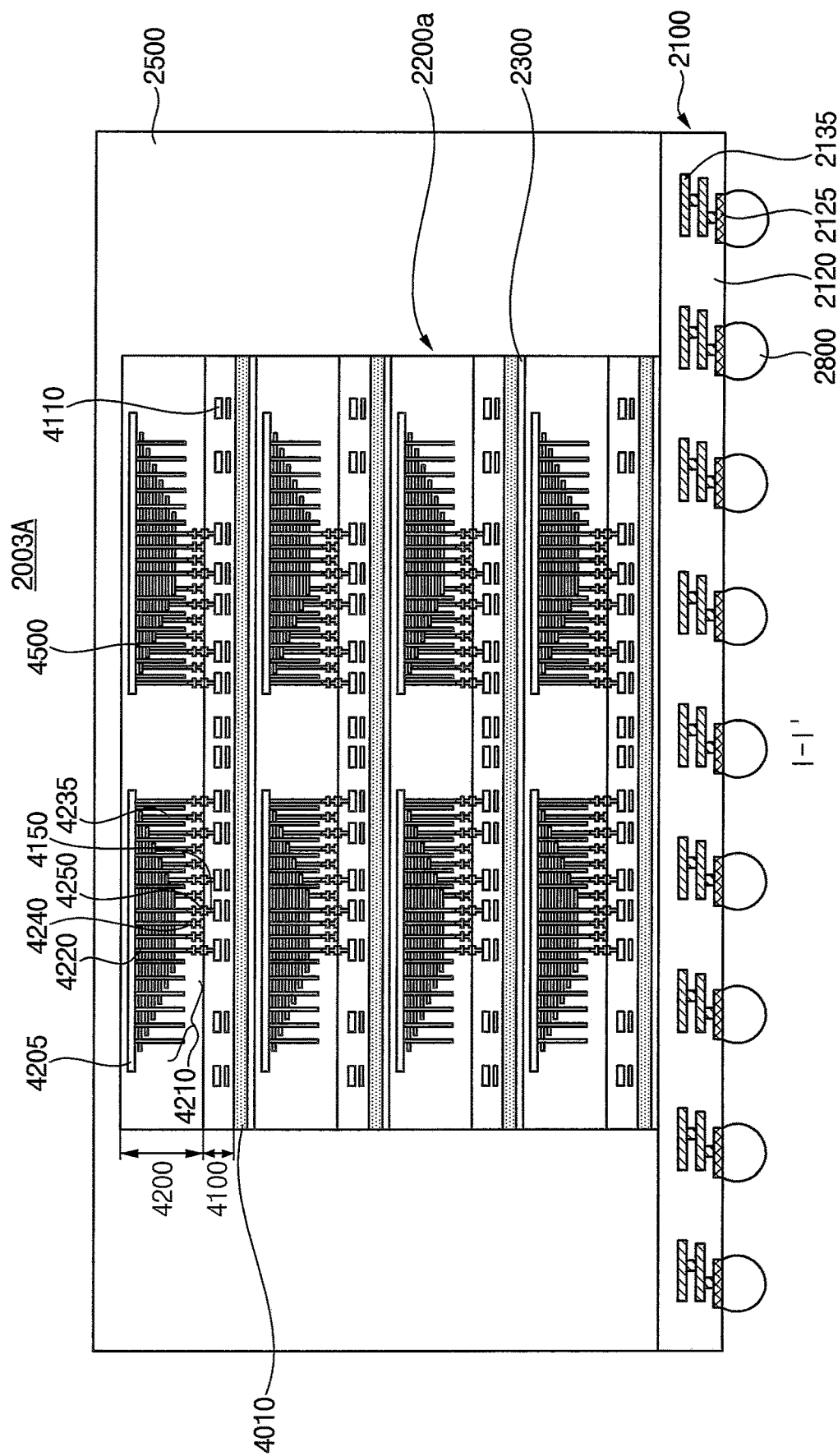
FIG. 31 illustrates a cross-sectional schematic view of semiconductor package in accordance with embodiments of the inventive concepts.

FIGS. 30 and 31 illustrate schematic cross-sectional views of semiconductor packages in accordance with embodiments of the inventive concepts. Each of FIGS. 30 and 31 is an example embodiment of the semiconductor package shown in FIG. 29. Each of FIGS. 30 and 31 conceptually show a portion along line of I-I' in FIG. 29.

Referring to FIG. 30, in the semiconductor package 2003, the package substrate 2100 may be a printed circuit board. The package substrate 2100 may include a package substrate body part 2120, package upper pads (refer to FIG. 29, 2130) disposed on an upper surface of the package substrate body part 2120, lower pads 2125 disposed at a lower surface of the package substrate body part 2120 or exposed through the lower surface of the package substrate body 2120, and internal wirings 2135 for electrically connecting with the upper pads 2130 and the lower pads 2125 in an inner portion of the package substrate body part 2120. The upper pads 2130 may be electrically connected to the connection structures 2400. The lower pads 2125 may be connected to the wiring patterns 2005 of the main substrate 2001 in the electronic system 2000 as shown in FIG. 29 through the conductive connection parts 2800.

Each of the semiconductor chips 2200 may include a semiconductor substrate 3010 and a first structure 3100 and a second structure 3200 sequentially stacked on the semiconductor substrate 3010. The first structure 3100 may include a peripheral circuit region including peripheral wirings 3110. The second structure 3200 may include a common source line 3205, a cell stacked structure 3210 on the common source line 3205, channel structures 3220 and separation structures (not shown) passing through the cell stacked structure 3210, bit lines 3240 electrically connected to the channel structures 3220, and gate connection wirings 3235 electrically connected to the word lines (refer to FIG. 28, WL) in the cell stacked structure 3210.

In addition, a support structure 3500 may pass through the cell stacked structure and the support structure 3500 may be disposed between the connection wirings. The support structure 3500 may support a portion for forming the connection wiring in the cell stacked structure. The support structure 3500 may be substantially the same as the support structure illustrated with reference to FIG. 1, 4A, 4B, 5, or 26.

In example embodiments, each of the semiconductor chips 2200 may include, e.g., the vertical memory device having the COP structure illustrated with reference to FIG. 1, 4A, 4B, 5, or 26.

Each of the semiconductor chips 2200 may further include a through via contact 3245 being electrically connected to the peripheral wirings 3110 of the first structure 3100 and extending into an inner portion of the second structure 3200.

Some of the through via contacts 3245 may be disposed beside of the cell stacked structure. Some of the through via contacts 3245 may pass through the cell stacked structure. Each of the semiconductor chips 2200 may further include the input/output pad 2210 electrically connected to the peripheral wirings 3110 of the first structure 3100.

Referring to FIG. 31, in the semiconductor package 2003A, each of the semiconductor chips 2200a may include a semiconductor substrate 4010, a first structure 4100 on the semiconductor substrate 4010, and a second structure 4200 bonded on the first structure 4100. The second structure 4200 may be bonded on the first structure 4100 by a wafer bonding process.

The first structure 4100 may include a peripheral circuit region in which a peripheral wiring 4110 and first bonding structures 4150 are formed.

The second structure 4200 may include a common source line 4205, a cell stacked structure 4210 between the common source line 4205 and the first structure 4100, channel structures 4220 and a separation structure (not shown) passing through the cell stacked structure 4210, and second bonding structures 4250 electrically connected to the word lines (refer to FIG. 28, WL) of the cell stacked structure 4210 and the channel structures 4220. For example, in the second bonding structures 4250, the channel structures 4220 and the word lines (refer to FIG. 28, WL) and the gate may be electrically connected to each other by connection wirings 4235 for connecting the word lines (refer to FIG. 28, WL) and the gate of upper and lower transistors of the cell stacked structure 4210.

In addition, a support structure 4500 may pass through the cell stacked structure 4210 and the support structure 4500 may be disposed between the connection wirings 4235. The support structure 4500 may support a portion for forming the connection wiring 4235 in the cell stacked structure 4210. The support structure 4500 may be substantially the same as the support structure illustrated with reference to FIG. 1, 4A, 4B, 5, or 26.

In example embodiments, each of the semiconductor chips 2200a may include, e.g., the vertical memory device having the COP structure illustrated with reference to FIG. 1 or 25.

The first bonding structures 4150 of the first structure 4100 and the second bonding structures 4250 of the second structure 4200 may be bonded to each other. A bonding portion between the first bonding structures 4150 and the second bonding structures 4250 may be formed of, e.g., copper (Cu).

Each of the semiconductor chips 2200a may further include an input/output pad (2210, referring to FIG. 29) electrically connected to the peripheral wirings 4110 of the first structure 4100.

The semiconductor chips 2200 shown in FIG. 30 and the semiconductor chips 2200a shown in FIG. 31 may be electrically connected to each other by the connection structures 2400 having wire bonding type. In some example embodiments, semiconductor chips in one semiconductor package, such as the semiconductor chips 2200 shown in FIG. 30 and the semiconductor chips 2200a shown in FIG. 31, may be electrically connected to each other by the connection structures 2400 including the through silicon vias.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the inventive concepts. Accordingly, all such modifications are intended to be included within the scope of the inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A vertical memory device, comprising:
   a cell stacked structure including gate patterns and insulation layers on a substrate, the gate patterns spaced apart from each other in a vertical direction perpendicular to an upper surface of the substrate, and the insulation layers between the gate patterns in the vertical direction, the gate patterns extending in a first direction parallel to the upper surface of the substrate, and edges of the gate patterns along the first direction being step portions having step shape;
   a support structure that passes through the cell stacked structure and passes through a step portion from among the step portions of one of the gate patterns, the support structure including a first spacer layer having cup shape, first metal patterns, and a second metal pattern filling an inner space of the first spacer layer, each of the first metal patterns having ring shape surrounding an outer wall of the first spacer layer; and
   cell contact plugs respectively on the step portions of the gate patterns,
   wherein the first metal patterns are respectively disposed at vertical levels of corresponding ones of the gate patterns, and a sidewall of each of the first metal patterns is adjacent to a sidewall of each of the corresponding ones of the gate patterns,
   the support structure fills a dummy channel hole that passes through the cell stacked structure and fills gaps connected with a sidewall of the dummy channel hole, the gaps are spaced apart from each other in the vertical direction, and the first metal patterns are in the gaps, and
   the first spacer layer is on a sidewall and a bottom of the dummy channel hole, and on the sidewalls of the first metal patterns.

2. The vertical memory device of claim 1, wherein an upper diameter of the dummy channel hole is greater than a lower diameter of the dummy channel hole, and a diameter of the dummy channel hole gradually decreases from a top of the dummy channel hole to the bottom of the dummy channel hole.

3. The vertical memory device of claim 1, wherein a vertical thickness of the step portions of the gate patterns are greater than a vertical thickness of extension portions of the gate patterns, the extension portions being unexposed portions that are covered by overlying ones of the step portions.

4. The vertical memory device of claim 3, wherein a vertical thickness of the first metal patterns adjacent to the step portions of the gate patterns are greater than a vertical thickness of the first metal patterns below the step portions of the gate patterns.

5. The vertical memory device of claim 1, further comprising a blocking layer including a metal oxide surrounding a surface of each of the gate patterns, the blocking layer being between the sidewalls of the first metal patterns and the sidewalls of the gate patterns adjacent thereto.

6. The vertical memory device of claim 1, wherein bottoms of the cell contact plugs contact the step portions of the gate patterns, or contact the step portions of the gate patterns and upper surfaces of the first metal patterns adjacent thereto.

7. The vertical memory device of claim 1, further comprising channel structures that pass through the cell stacked structure away from the step portions of the gate patterns, wherein upper surfaces of the channel structures are below an upper surface of the support structure.

8. The vertical memory device of claim 1, further comprising a through via contact spaced apart from the cell stacked structure and extending in the vertical direction,
   wherein an upper surface of the through via contact is coplanar with an upper surface of the support structure, and a lower surface of the through via contact is below a lower surface of the support structure.

9. The vertical memory device of claim 1, wherein the first metal patterns are on the outer wall of the first spacer layer spaced apart from each other in the vertical direction, and the first metal patterns protrude from the outer wall of the first spacer layer as having a comb shape in a cross sectional view.

10. The vertical memory device of claim 1, wherein the support structure is disposed between the cell contact plugs.

11. A vertical memory device, comprising:
    a circuit pattern on a substrate including a first region, a second region, a third region;
    a cell stacked structure over the circuit pattern on the first region and the second region, the cell stacked structure including gate patterns and insulation layers, the gate patterns spaced apart from each other in a vertical direction perpendicular to an upper surface of the substrate, and the insulation layers between the gate patterns in the vertical direction, the gate patterns extending in a first direction parallel to the upper surface of the substrate, and edges of the gate patterns along the first direction being step portions having step shape;
    a channel structure that passes through the cell stacked structure in the first region;
    a support structure that passes through the cell stacked structure in the second region and passes through a step portion from among the step portions of one of the gate patterns, the support structure including a first spacer layer having cup shape, first metal patterns, and a second metal pattern filling an inner space of the first spacer layer, each of the first metal patterns having ring shape surrounding an outer wall of the first spacer layer;

a through via contact spaced apart from the cell stacked structure, the through via contact extending in the vertical direction;

cell contact plugs respectively on the step portions of the gate patterns; and a blocking layer surrounding a surface of each of the gate patterns, wherein the first metal patterns are respectively disposed at vertical levels of corresponding ones of the gate patterns, and the blocking layer is interposed between sidewalls of the first metal patterns and sidewalls of the gate patterns adjacent thereto, wherein the first metal patterns are on the outer wall of the first spacer layer spaced apart from each other in the vertical direction, and the first metal patterns protrude from the outer wall of the first spacer layer as having a comb shape in a cross sectional view.

12. The vertical memory device of claim 11, wherein the blocking layer comprises a metal oxide.

13. The vertical memory device of claim 11, wherein an upper surface of the through via contact is coplanar with an upper surface of the support structure, and a lower surface of the through via contact is lower than a lower surface of the support structure.

14. The vertical memory device of claim 11, further comprising a second spacer surrounding a sidewall of the through via contact, the second spacer and the first spacer layer including a same material.

15. The vertical memory device of claim 14, wherein an upper diameter of a structure including the through via contact and the second spacer is greater than an upper diameter of the support structure.

16. The vertical memory device of claim 11, wherein the through via contact and the second metal pattern include a same material.

17. The vertical memory device of claim 11, wherein bottoms of the cell contact plugs contact the step portions of the gate patterns, or contact the step portions of the gate patterns and upper surfaces of the first metal patterns adjacent thereto.

18. A vertical memory device, comprising:

a circuit pattern on a substrate including a first region, a second region, and a third region;

a lower cell stacked structure over the circuit pattern on the first region and the second region, the lower cell stacked structure including first gate patterns and first insulation layers, the first gate patterns spaced apart from each other in a vertical direction perpendicular to an upper surface of the substrate, and the first insulation layers between the first gate patterns in the vertical direction, the first gate patterns extending in a first direction parallel to the upper surface of the substrate, and edges of the first gate patterns along the first direction being step portions having step shape;

an upper cell stacked structure on the lower cell stacked structure, the upper cell stacked structure including second gate patterns and second insulation layers, the second gate patterns spaced apart from each other in the vertical direction, and the second insulation layers between the second gate patterns in the vertical direction, the second gate patterns extending in the first direction parallel to the upper surface of the substrate, and edges of the second gate patterns along the first direction being step portions having the step shape;

channel structures that pass through the lower cell stacked structure and the upper cell stacked structure in the first region, each of the channel structures including a bent portion at a boundary between the lower cell stacked structure and the upper cell stacked structure;

a support structure that passes through a structure including the upper cell stacked structure and the lower cell stacked structure in the second region and that passes through a step portion from among the step portions of one of the first and second gate patterns, the support structure including a first spacer layer having cup shape, first metal patterns, and a second metal pattern filling an inner space of the first spacer layer, each of the first metal patterns having a ring shape surrounding an outer wall of the first spacer layer;

a through via contact spaced apart from the upper cell stacked structure and the lower cell stacked structure, the through via contact extending in the vertical direction and electrically connected the circuit pattern; and cell contact plugs respectively on the step portions of each of the first and second gate patterns, wherein the first metal patterns are respectively disposed at vertical levels of corresponding ones of the first and second gate patterns, wherein the through via contact and the second metal pattern include a same material, and wherein the first metal patterns are on the outer wall of the first spacer layer spaced apart from each other in the vertical direction, and the first metal patterns protrude from the outer wall of the first spacer layer as having a comb shape in a cross sectional view.

19. The vertical memory device of claim 18, wherein an upper surface of each of the channel structures is below an upper surface of the support structure.

20. The vertical memory device of claim 18, further comprising a blocking layer including a metal oxide surrounding a surface of each of the first and second gate patterns, the blocking layer being between sidewalls of the first metal patterns and sidewalls of the first and second gate patterns adjacent thereto.

* * * * *